(12) United States Patent
Moyama et al.

(10) Patent No.: US 11,043,389 B2
(45) Date of Patent: Jun. 22, 2021

(54) SUBSTRATE PROCESSING METHOD

(71) Applicant: TOKYO ELECTRON LIMITED, Tokyo (JP)

(72) Inventors: Kazuki Moyama, Miyagi (JP); Kazuya Nagaseki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/881,073

(22) Filed: May 22, 2020

(65) Prior Publication Data
US 2020/0373166 A1  Nov. 26, 2020

(30) Foreign Application Priority Data
May 22, 2019 (JP) .............................. JP2019-095705

(51) Int. Cl.
  *H01L 21/3065* (2006.01)
(52) U.S. Cl.
  CPC ................ *H01L 21/3065* (2013.01)
(58) Field of Classification Search
  None
  See application file for complete search history.

(56) References Cited

U.S. PATENT DOCUMENTS

| | | | | |
|---|---|---|---|---|
| 2004/0261712 A1* | 12/2004 | Hayashi | ............ | H01L 21/67069 118/723 E |
| 2006/0137610 A1* | 6/2006 | Yoshizaki | ............ | H01J 37/3244 118/723 E |
| 2014/0361102 A1* | 12/2014 | Hatoh | ............ | H01L 29/84 239/416.2 |
| 2016/0172217 A1* | 6/2016 | Miyata | ............ | H01J 37/32834 156/345.29 |
| 2020/0083063 A1* | 3/2020 | Shin | ............ | H01L 21/02057 |
| 2020/0381220 A1* | 12/2020 | He | ............ | H01J 37/32082 |

FOREIGN PATENT DOCUMENTS

JP  5709344 B2  4/2015

* cited by examiner

*Primary Examiner* — Shamim Ahmed
(74) *Attorney, Agent, or Firm* — Rothwell, Figg, Ernst & Manbeck, P.C.

(57) ABSTRACT

A substrate processing method includes a first expanding step, a first gas supplying step, a first plasma processing step, and a first power stopping step. The first expanding step increases the volume of a gas diffusion chamber. The first gas supplying step supplies a first gas into the gas diffusion chamber. The first plasma processing step supplies radio-frequency power from a radio-frequency power supply to generate plasma in a processing chamber accommodating a substrate and reduces the volume of the gas diffusion chamber. The first power stopping step stops the supply of the radio-frequency power after the first plasma processing step.

19 Claims, 30 Drawing Sheets

FIG. 3

| Step | Lid | V1 | V3 | RF | OPERATION |
|---|---|---|---|---|---|
| 1 | Bottom | Close | Open | Off | EXHAUST |
| 2 | Bot→Top | Open | Close | Off | RAISE LID, SUPPLY GAS A |
| 3 | Top→Bot | Close | Open | On | LOWER LID, PROCESS A |
| 4 | Bottom | Close | Open | Off | EXHAUST |

FIG. 6

| Step | Lid | V1 | V3 | RF | OPERATION |
|---|---|---|---|---|---|
| 1 | Bottom | Close | Open | Off | EXHAUST |
| 2 | Bot→Top | Open | Close | Off | RAISE LID, SUPPLY GAS A |
| 3 | Top→Bot | Open | Close | On | LOWER LID, PROCESS A |
| 4 | Bottom | Close | Open | Off | EXHAUST |

FIG. 9

| Step | Lid | V1 | V3 | RF | OPERATION |
|---|---|---|---|---|---|
| 1 | Bottom | Close | Open | Off | EXHAUST |
| 2 | Bot→Top | Open | Close | Off | RAISE LID, SUPPLY GAS A |
| 3 | Top | Open | Close | On | PROCESS A |
| 4 | Top→Bot | Close | Open | On | LOWER LID, PROCESS A |
| 5 | Bottom | Close | Open | Off | EXHAUST |

FIG. 12

| Step | Lid | V1 | V2 | V3 | V4 | RF | OPERATION |
|---|---|---|---|---|---|---|---|
| 1 | Bottom | Close | Close | Open | Open | Off | EXHAUST |
| 2 | Bot→Top | Open | Close | Close | Open | Off | RAISE LID, SUPPLY GAS A |
| 3 | Top→Bot | Close | Close | Open | Open | On | LOWER LID, PROCESS A |
| 4 | Bottom | Close | Open | Open | Open | Off | EXHAUST |
| 5 | Bot→Top | Close | Close | Open | Close | Off | RAISE LID, SUPPLY GAS B |
| 6 | Top→Bot | Close | Close | Open | Open | On | PROCESS B |
| 7 | Bottom | Close | Close | Open | Open | Off | EXHAUST |

FIG. 14

| Step | Lid | V1 | V2 | V3 | V4 | RF | OPERATION |
|---|---|---|---|---|---|---|---|
| 1 | Bottom | Close | Close | Open | Open | Off | EXHAUST |
| 2 | Bot→Top | Open | Close | Close | Open | Off | RAISE LID, SUPPLY GAS A |
| 3 | Top→Bot | Open | Close | Close | Open | On | LOWER LID, PROCESS A |
| 4 | Bottom | Close | Close | Open | Open | Off | EXHAUST |
| 5 | Bot→Top | Close | Open | Open | Close | Off | RAISE LID, SUPPLY GAS B |
| 6 | Top→Bot | Close | Open | Open | Close | On | PROCESS B |
| 7 | Bottom | Close | Close | Open | Open | Off | EXHAUST |

FIG. 16

| Step | Lid | V1 | V2 | V3 | V4 | RF | OPERATION |
|---|---|---|---|---|---|---|---|
| 1 | Bottom | Close | Close | Open | Open | Off | EXHAUST |
| 2 | Bot→Top | Open | Close | Close | Open | Off | RAISE LID, SUPPLY GAS A |
| 3 | Top | Open | Close | Close | Open | On | PROCESS A |
| 4 | Top→Bot | Close | Close | Open | Open | On | LOWER LID, PROCESS A |
| 5 | Bottom | Close | Close | Open | Open | Off | EXHAUST |
| 6 | Bot→Top | Open | Open | Open | Close | Off | RAISE LID, SUPPLY GAS B |
| 7 | Top | Close | Close | Open | Open | On | PROCESS B |
| 8 | Top→Bot | Close | Close | Open | Open | On | LOWER LID, PROCESS B |
| 9 | Bottom | Close | Close | Open | Open | Off | EXHAUST |

FIG. 23

| Step | Lid | V1 | V2 | V5 | V6 | RF | OPERATION |
|---|---|---|---|---|---|---|---|
| 1 | Bottom | Close | Close | Open | Open | Off | EXHAUST |
| 2 | Bot→Top | Open | Close | Open | Open | Off | RAISE LID, SUPPLY GAS A |
| 3 | Top→Bot | Close | Close | Open | Open | On | LOWER LID, PROCESS A |
| 4 | Bottom | Close | Open | Open | Open | Off | EXHAUST |
| 5 | Bot→Top | Close | Close | Open | Open | Off | RAISE LID, SUPPLY GAS B |
| 6 | Top→Bot | Close | Close | Open | Open | On | PROCESS B |
| 7 | Bottom | Close | Close | Open | Open | Off | EXHAUST |

SUBSTRATE PROCESSING METHOD

CROSS-REFERENCE TO RELATED APPLICATIONS

This application is based on and claims priority from Japanese Patent Application No. 2019-095705, filed on May 22, 2019 with the Japan Patent Office, the disclosure of which is incorporated herein in its entirety by reference.

TECHNICAL FIELD

The present disclosure relates to a substrate processing method.

BACKGROUND

A manufacturing process of semiconductor devices may include switching a plurality of process gases, and repeating lamination and removal of a substrate. See, for example, Japanese Patent No. 5709344.

SUMMARY

A substrate processing method according to one embodiment of the present disclosure includes a first expanding step, a first gas supplying step, a first plasma processing step, and a first power stopping step. The first expanding step increases a volume of a gas diffusion chamber. The first gas supplying step supplies a first gas into the gas diffusion chamber. The first plasma processing step supplies radio-frequency power from a radio-frequency power supply to generate plasma in a processing chamber accommodating a substrate and reduces the volume of the gas diffusion chamber. The first power stopping step stops the supply of the radio-frequency power after the first plasma processing step.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a view illustrating an example of an operation state of each part of the substrate processing apparatus according to the first embodiment.

FIG. 6 is a view illustrating an example of an operation state of each part of a substrate processing apparatus according to the first modification.

FIG. 9 is a view illustrating an example of an operation state of each part of a substrate processing apparatus according to the second modification.

FIG. 12 is a view illustrating an example of an operation state of each part of a substrate processing apparatus according to the second embodiment.

FIG. 14 is a view illustrating an example of an operation state of each part of a substrate processing apparatus according to a third modification.

FIG. 16 is a view illustrating an example of an operation state of each part of a substrate processing apparatus according to a fourth modification.

FIG. 23 is a view illustrating an example of an operation state of each part of a substrate processing apparatus according to the seventh modification.

DESCRIPTION OF EMBODIMENT

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the disclosed substrate processing method will be described in detail with reference to the drawings. It is to be noted that the disclosed technology is not limited by the following embodiments.

In the related art, when switching a plurality of processing gases (e.g., two kinds of processing gases, i.e., a gas A and a gas B), supply of the gas A is stopped, and exhaust of a processing chamber is then started. Then, after exhaust of the gas A, supply of the gas B is started. Therefore, it takes time to switch between the gas A and the gas B. In contrast, there has been proposed a technique for switching processing gases at a high speed by dividing a gas distribution member adjacent to the surface of a substrate into an inner section and an outer section and supplying different types of processing gases to the inner and outer sections, respectively. However, when the switching of the processing gases is performed by dividing the gas distribution member, it is difficult to reduce the exhaust time of a processing gas in a processing chamber. Therefore, there is a desire for reduction of the exhaust time of the processing gas. Further, since the flow rate to the processing chamber depends on the flow rate of the processing gas from a source, it is difficult to finely control the flow rate. Therefore, there is a desire for control of the flow rate to the processing chamber.

[Overall Configuration of Substrate Processing Apparatus 10]

Figure 1:
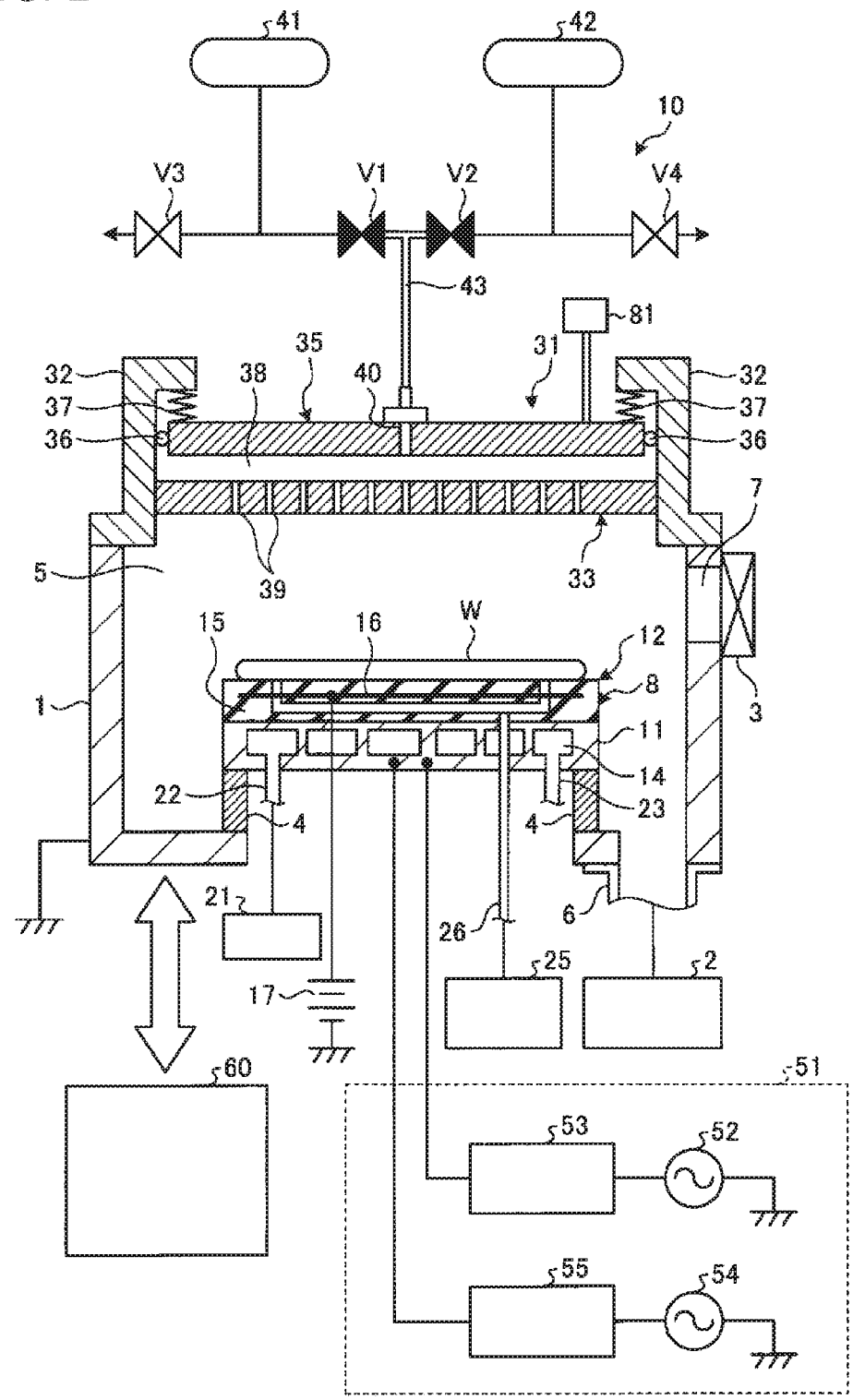
FIG. 1 is a view illustrating an example of a substrate processing apparatus according to an embodiment of the present disclosure.

FIG. 1 is a view illustrating an example of a substrate processing apparatus according to an embodiment of the present disclosure. The substrate processing apparatus 10 illustrated in FIG. 1 is a capacitively-coupled plasma processing apparatus. The substrate processing apparatus 10 includes a chamber 1, an exhauster 2, and a gate valve 3. The chamber 1 is made of, for example, aluminum. The chamber 1 is formed in a cylindrical shape, and its surface is anodized. The chamber 1 is electrically grounded. The chamber 1 includes therein a processing chamber 5 serving as a processing space. The chamber 1 isolates the processing chamber 5 from the external atmosphere. An exhaust port 6 and an opening 7 are further formed in the chamber 1. The exhaust port 6 is formed on the bottom surface of the chamber 1. The opening 7 is formed in a side wall of the chamber 1. The exhauster 2 is connected to the processing chamber 5 of the chamber 1 via the exhaust port 6. The exhauster 2 exhausts a gas from the processing chamber 5 through the exhaust port 6. The gate valve 3 opens or closes the opening 7.

The substrate processing apparatus 10 further includes a stage 8. The stage 8 is disposed in the processing chamber 5 and is installed at the bottom of the chamber 1 via a support member 4. The stage 8 includes a support table 11 and an electrostatic chuck 12. The support table 11 is made of a conductive material such as aluminum (Al), titanium (Ti), or silicon carbide (SiC). The support table 11 is supported by the chamber 1 via the support member 4 that is in contact with the peripheral edge of the lower surface. The support member 4 is made of an insulating material and is formed in a ring shape. The support member 4 is disposed together with the stage 8 to close an opening formed at the bottom of the chamber 1. A coolant flow path 14 is formed inside the support table 11. The electrostatic chuck 12 is disposed above the support table 11 and is supported by the support table 11. The electrostatic chuck 12 includes an electrostatic chuck body 15 and a chuck electrode 16. The electrostatic chuck body 15 is made of an insulating material. The electrostatic chuck 12 is formed by embedding the chuck electrode 16 inside the electrostatic chuck body 15. The substrate processing apparatus 10 further includes a DC voltage source 17. The DC voltage source 17 is electrically connected to the chuck electrode 16 and supplies a DC current to the chuck electrode 16.

The substrate processing apparatus 10 further includes a chiller 21, a coolant inlet pipe 22, and a coolant outlet pipe 23. The chiller 21 is connected to the coolant flow path 14 via the coolant inlet pipe 22 and the coolant outlet pipe 23. The chiller 21 cools a cooling medium (e.g., as cooling water or brine) and circulates the cooled cooling medium through the coolant inlet pipe 22 and the coolant outlet pipe 23 to the coolant flow path 14 to cool the electrostatic chuck 12 of the stage 8.

The substrate processing apparatus 10 further includes a heat transfer gas source 25 and a heat transfer gas line 26. The heat transfer gas line 26 is formed such that its one end is formed on the upper surface of the electrostatic chuck 12. The heat transfer gas source 25 supplies a heat transfer gas (e.g., a helium (He) gas or an argon (Ar) gas) to the heat transfer gas line 26 to supply the heat transfer gas between the electrostatic chuck 12 and a wafer W placed on the stage 8.

The substrate processing apparatus 10 further includes a gas supply 31 and a top plate support 32. The gas supply 31 includes a shower plate 33, a top plate 35, a seal member 36, and a bellows 37. The top plate support 32 is made of, for example, aluminum. The top plate support 32 is formed in a cylindrical shape so as to be disposed on the upper portion of the side wall of the chamber 1, and its surface is anodized. The top plate support 32 is connected to the top plate 35 via the bellows 37.

The shower plate 33 is made of a conductive material and is formed in a disc shape. The shower plate 33 is disposed to face the stage 8 such that a plane along the lower surface of the shower plate 33 is substantially parallel to a plane along the upper surface of the stage 8. The shower plate 33 is further disposed to close an opening formed in the ceiling of the chamber 1. The shower plate 33 is supported by the chamber 1 via the top plate support 32 such that the shower plate 33 and the chamber 1 are electrically interconnected.

The top plate 35 is made of a conductive material and is formed in a disc shape. The top plate 35 is disposed to face the shower plate 33 such that a plane along the lower surface of the top plate 35 is substantially parallel to a plane along the upper surface of the shower plate 33. The top plate 35 has a drive device 81. The drive device 81 may be an actuator, a motor, an air cylinder and/or other device that controllably urges the top plate 35 upward and downward with respect to the shower plate 33. The seal member 36 is made of a flexible material and is formed in a ring shape. The seal member 36 moves together with the top plate 35 when the top plate 35 is moved up and down while maintaining the airtightness between the top plate support 32 and the peripheral portion of the top plate 35. The top plate 35 forms a gas diffusion chamber 38 together with the top plate support 32, the shower plate 33, and the seal member 36.

The bellows 37 is formed to be extendable and contractible. The bellows 37 connects a flange provided on the upper portion of the top plate support 32 and the upper surface of the peripheral portion of the top plate 35. The top plate 35 is moved up and down by the drive device 81. That is, the gas supply 31 is able to change the volume of the gas diffusion chamber 38 by moving the top plate 35 up and down. That is, the gas supply 31 is an example of a gas supply having a variable volume mechanism. As will be described later, the gas diffusion chamber 38 may be divided into a plurality of regions, for example, a central portion and a peripheral portion, and its volume may be changed by a corresponding top plate. Further, the volume of the gas diffusion chamber 38 may be changed not only by the vertical movement of the top plate 35 but also by, for example, a balloon or a piston provided in the gas diffusion chamber 38. Alternatively, the top plate 35 may be fixed, and the shower plate 33 may be moved up and down.

The shower plate 33 has a plurality of gas supply holes 39 formed to communicate the processing chamber 5 with the gas diffusion chamber 38. The gas supply holes 39 are an example of gas holes. A gas introduction port 40 is formed at the center of the top plate 35 and communicates with the gas diffusion chamber 38.

The substrate processing apparatus 10 further includes processing gas sources 41 and 42. The processing gas sources 41 and 42 are connected to a gas introduction pipe 43 via their respective gas pipes having valves V1 and V2, respectively, and the gas introduction pipe 43 is connected to the gas introduction port 40. The processing gas sources 41 and 42 supply predetermined processing gases to the gas introduction port 40. Each of the processing gases may contain a plurality of gases. The processing gas is, for example, a fluorine-containing gas or an oxygen-containing gas. In addition, a predetermined compound may be further added to the processing gas. Examples of the compound may include a compound containing hydrogen, nitrogen, and chlorine. The gas introduction pipe 43 is configured such that its portion is extensible or movable in accordance with the vertical movement of the top plate 35. Examples of the gas introduction pipe 43 may include a flexible tube. A plurality of gas introduction ports 40 and a plurality of gas introduction pipes 43 may be provided. Valves V3 and V4 have their one ends connected between the processing gas sources 41 and 42 and the valves V and V2, respectively, and their other ends connected to the exhauster 2. The valves V3 and V4 are opened when the valves V1 and V2 are closed.

The support table 11 of the stage 8 is used as a lower electrode, and the shower plate 33 is used as an upper electrode. The substrate processing apparatus 10 further includes a power supply device 51. The power supply device 51 includes a first radio-frequency power supply 52, a first matching device 53, a second radio-frequency power supply 54, and a second matching device 55. The first radio-frequency power supply 52 is connected to the stage 8 via the first matching device 53. The first radio-frequency power supply 52 supplies predetermined first radio-frequency power of a first frequency (e.g., 40 MHz) to the support table 11 of the stage 8. The first matching device 53 matches the load impedance with the internal (or output) impedance of the first radio-frequency power supply 52. The first matching device 53 acts to apparently match the load impedance with the internal impedance of the first radio-frequency power supply 52 when plasma is generated in the processing chamber 5.

The second radio-frequency power supply 54 is connected to the stage 8 via the second matching device 55. The second radio-frequency power supply 54 supplies predetermined second radio-frequency power of a second frequency (e.g., 0.4 MHz) lower than the first frequency to the stage 8. The second matching device 55 matches the load impedance with the internal (or output) impedance of the second radio-frequency power supply 54. The second matching device 55 acts to apparently match the load impedance with the internal impedance of the second radio-frequency power supply 54 when plasma is generated in the processing chamber 5.

The substrate processing apparatus 10 may further include a controller 60. The controller 60 may be a computer including a processor, a memory, an input device, and a display device. The controller 60 controls each unit of the substrate processing apparatus 10. In the controller 60, an operator may use the input device to perform, for example, a command input operation for managing the substrate processing apparatus 10. In the controller 60, the operation state of the substrate processing apparatus 10 may be visualized and displayed on the display device. Further, a control program for the processor to control various processes to be executed in the substrate processing apparatus 10, and recipe data are stored in the memory of the controller 60. The processor of the controller 60 executes the control program to control each unit of the substrate processing apparatus 10 according to the recipe data, so that a desired process is executed in the substrate processing apparatus 10.

For example, the controller 60 controls each unit of the substrate processing apparatus 10 such that two types of processing gases are alternately and repeatedly supplied to perform a desired process. To give a detailed example, the controller 60 executes a step of exhausting the gas diffusion chamber 38 in a state where the volume of the gas diffusion chamber 38 is reduced by lowering the top plate 35 and closing the valves V1 and V2. The controller 60 executes a step of raising the top plate 35 to increase the volume of the gas diffusion chamber 38, opening the valve V1 to introduce the gas A from the processing gas source 41, and forming a film on the wafer W with plasma of the gas A. The controller 60 executes a step of lowering the top plate 35, closing the valves V1 and V2, and exhausting the gas A in a state where the volume of the gas diffusion chamber 38 is reduced. The controller 60 executes a step of raising the top plate 35 to increase the volume of the gas diffusion chamber 38, opening the valve V2 to introduce the gas B from the processing gas source 42, and etching the film on the wafer W with plasma of the gas B. The controller 60 executes a step of lowering the top plate 35, closing the valves V1 and V2, and exhausting the gas B in a state where the volume of the gas diffusion chamber 38 is reduced. The controller 60 repeats these steps a desired number of times.

[Substrate Processing Method]

Figure 2A:
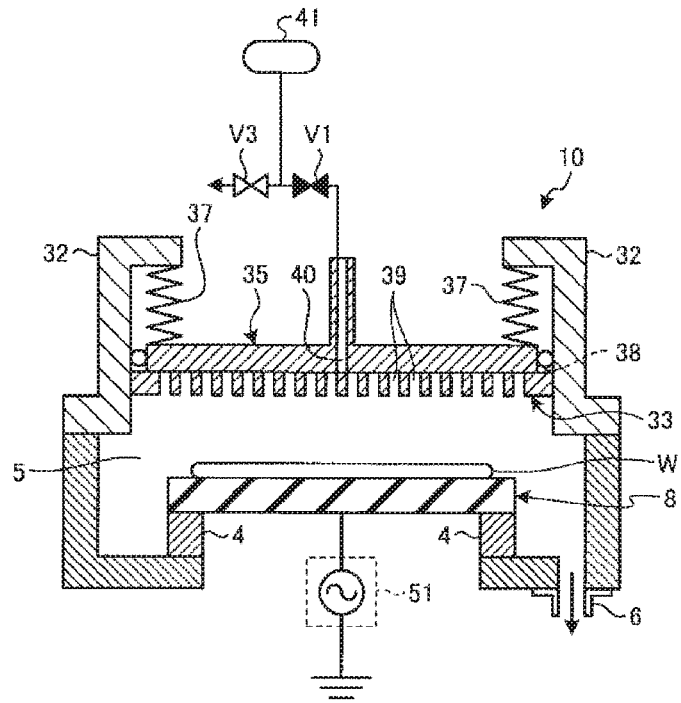
FIG. 2A is a view illustrating an example of a substrate processing method according to a first embodiment.
Figure 2B:
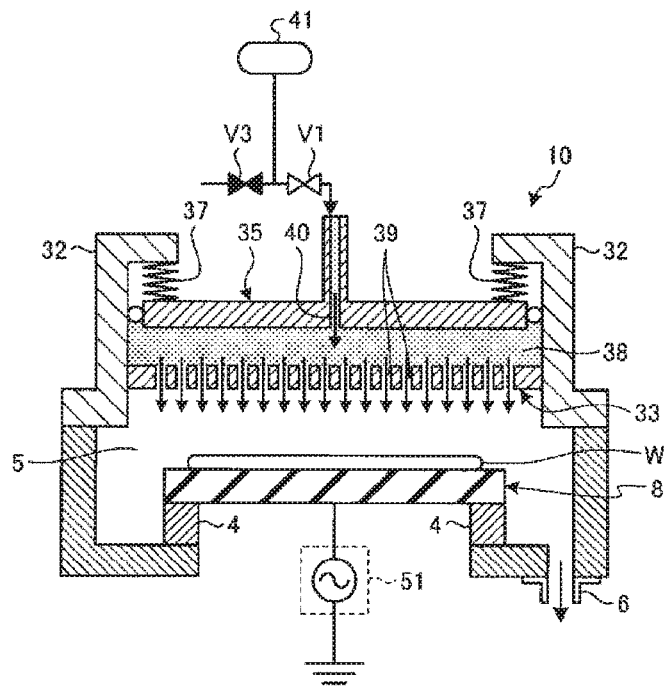
FIG. 2B is a view illustrating an example of the substrate processing method according to the first embodiment.
Figure 2C:
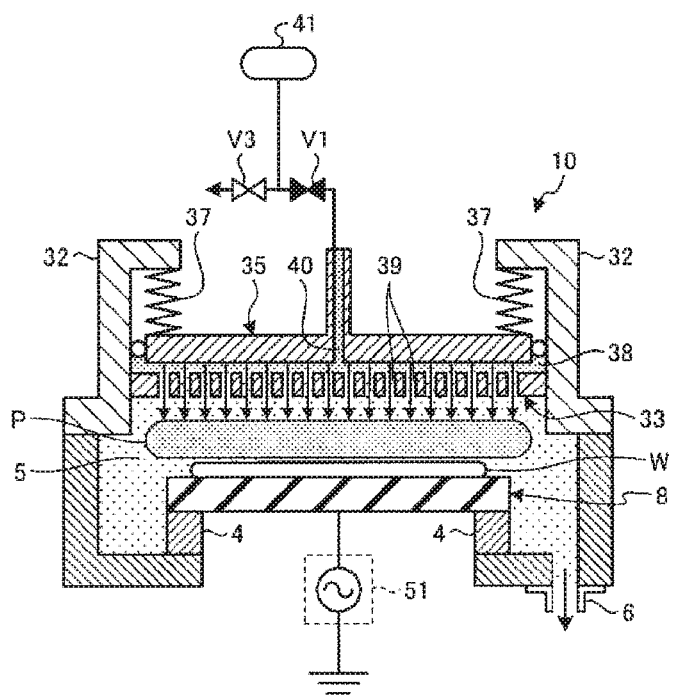
FIG. 2C is a view illustrating an example of the substrate processing method according to the first embodiment.
Figure 4:
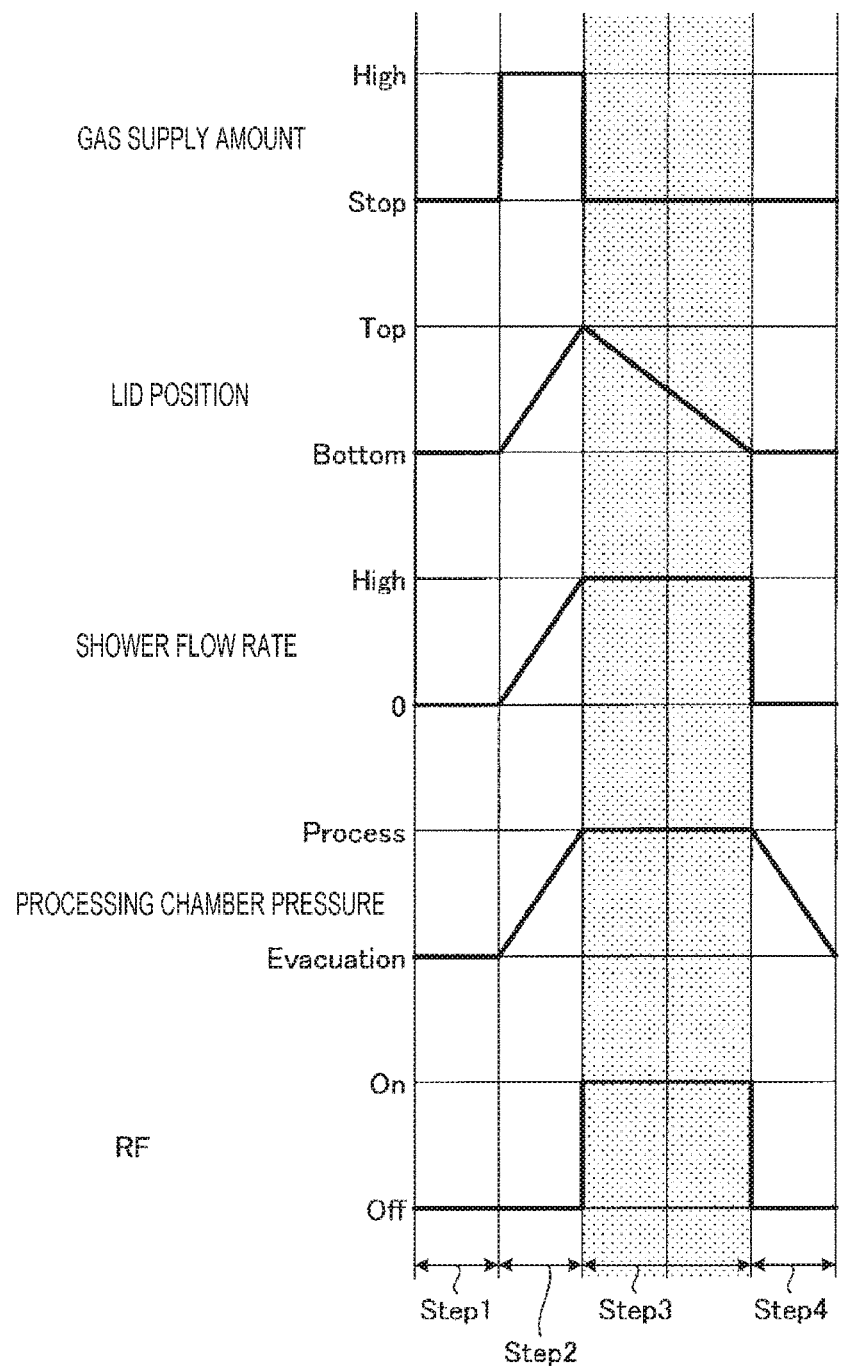
FIG. 4 is a timing chart illustrating an example of the substrate processing method according to the first embodiment.

Next, a substrate processing method according to a first embodiment will be described. In the first embodiment, descriptions will be made on a case where one type of processing gas is used in the substrate processing apparatus 10. FIGS. 2A to 2C are views illustrating an example of the substrate processing method according to the first embodiment. FIG. 3 is a view illustrating an example of an operation state of each part of the substrate processing apparatus according to the first embodiment. FIG. 4 is a timing chart illustrating an example of the substrate processing method according to the first embodiment. In FIGS. 3 and 4, a step of a process is denoted by "Step" the top plate 35 is denoted by "Lid," and the radio-frequency power is denoted by "RF." FIGS. 3 and 4 illustrate the valves V1 and V3, the radio-frequency power and the operation state in each step. It is assumed that the processing gas source 41 supplies the gas A.

In the substrate processing method according to the first embodiment, first, the controller 60 controls the gate valve 3 to open the opening 7. When the opening 7 is opened, the wafer W is loaded into the processing chamber 5 of the chamber 1 through the opening 7 and is placed on the stage 8. After the wafer W is placed on the stage 8, the controller 60 controls the gate valve 3 to close the opening 7. Further, the controller 60 controls the DC voltage source 17 to apply a DC voltage to the chuck electrode 16. When the DC voltage is applied to the chuck electrode 16, the wafer W is held on the electrostatic chuck 12 by a Coulomb force.

As illustrated in FIG. 2A, the controller 60 closes the valve V1 and controls the drive device 81 (not illustrated in FIG. 2A) of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIGS. 3 and 4). At this time, the top plate 35 is located at a lower end position (Bottom), the valve V1 is closed, and the valve V3 is opened.

When the wafer W is held on the electrostatic chuck 12, the controller 60 controls the heat transfer gas source 25 to supply a heat transfer gas to the heat transfer gas line 26 supplies the heat transfer gas to the heat transfer gas line 26 to supply the heat transfer gas between the electrostatic chuck 12 and the wafer W. Further, the controller 60 controls the chiller 21 to circulate a coolant cooled to a predetermined temperature through the coolant flow path 14 to cool the electrostatic chuck 12. At this time, as heat is transferred from the electrostatic chuck 12 to the wafer W via a heat transfer gas supplied between the electrostatic chuck 12 and the wafer 27, the temperature of the wafer W is adjusted to fall within a predetermined temperature range.

Next, as illustrated in FIG. 2B, when the exhaust is completed, the controller 60 controls the drive device 81 (not illustrated in FIG. 2B) of the top plate 35 to raise the top plate 35. The controller 60 moves the top plate 35 to an upper end position (Top) to increase the volume of the gas diffusion chamber 38. At this time, the controller 60 controls the valve V1 to be opened, the valve V3 to be closed, and the processing gas source 41 to supply the gas A to the gas introduction port 40. The gas A is supplied from the gas introduction port 40 into the gas diffusion chamber 38 and is diffused in the gas diffusion chamber 38. That is, the gas A is charged into the gas diffusion chamber 38 (Step 2 in FIGS. 3 and 4).

Subsequently, as illustrated in FIG. 2C, the controller 60 controls the valve V1 to be closed and the valve V3 to be opened, so that the supply of the gas A is stopped. The controller 60 controls the drive device 81 (not illustrated in FIG. 2C) of the top plate 35 to lower the top plate 35 at a first speed to reduce the volume of the gas diffusion chamber 38. The gas A is supplied into the processing chamber 5 through a plurality of gas supply holes 39.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIGS. 3 and 4). When the process using the gas A is completed, the controller 60 controls the power supply device 51 to stop the supply of the radio-frequency power. That is, as illustrated in FIG. 4, in Step 3, after the supply of the gas A from the processing gas source 41 is stopped, the top plate 35 is lowered and the gas A charged in the gas diffusion chamber 38 is used to perform a process using the plasma P.

When the volume of the gas diffusion chamber 38 is reduced, the controller 60 controls the exhauster 2 to exhaust the gas A from the processing chamber 5 (Step 4 in FIGS. 3 and 4). At this time, the top plate 35 is located at a lower end position (Bottom), the valve V1 is closed, and the valve V3 is opened. Thereafter, the controller 60 repeats the process such as charging with the gas A, processing with the gas A, and exhausting.

When a series of repetitive process is completed, the controller 60 controls the DC voltage source 17 to apply to the chuck electrode 16 a DC voltage whose polarity is opposite to that at the time of chucking the wafer W. When the opposite DC voltage is applied to the chuck electrode 16, the wafer W is neutralized and peeled from the electrostatic chuck 12. The controller 60 further controls the gate valve 3 to open the opening 7. The wafer W is unloaded from the processing chamber 5 of the chamber 1 through the opening 7.

In the first embodiment, by controlling the speed of lowering the top plate 35, the flow rate of the gas supplied into the processing chamber 5 may be controlled. Further, the exhaust time of the processing gas may be reduced.

[First Modification]

Figure 5A:
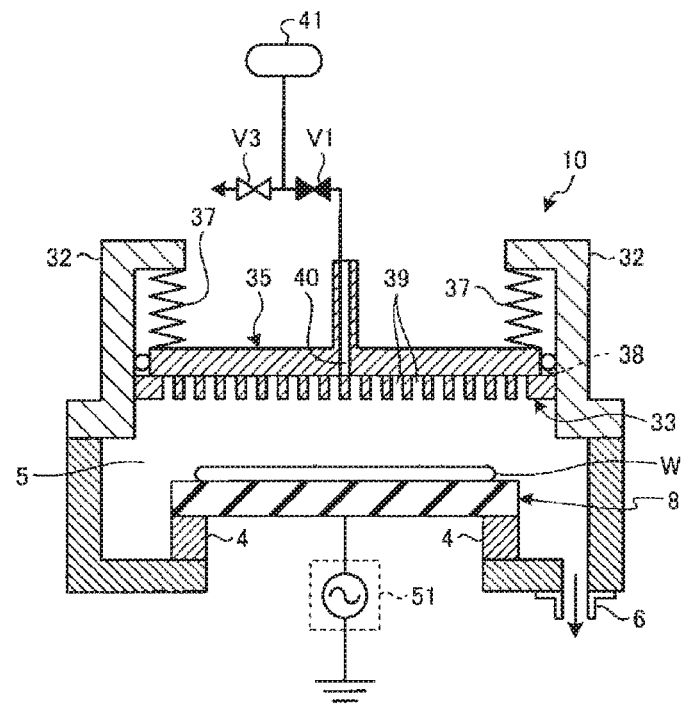
FIG. 5A is a view illustrating an example of a substrate processing method according to a first modification.
Figure 5B:
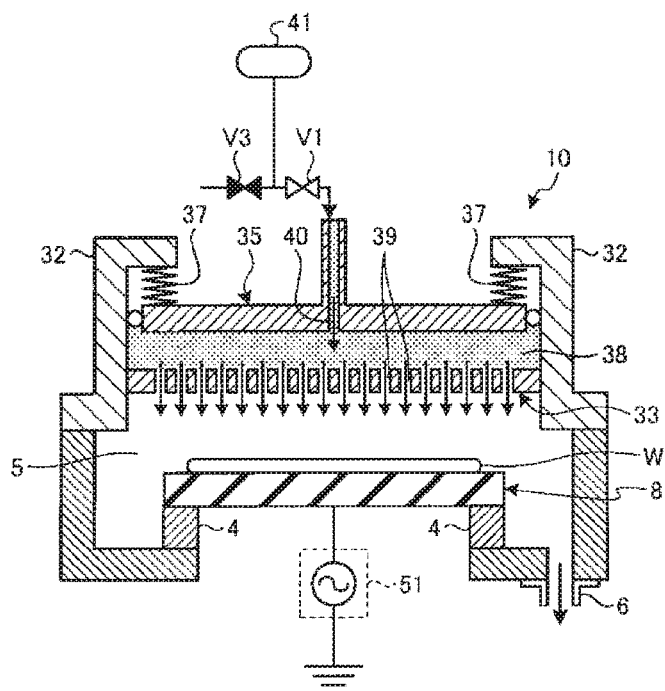
FIG. 5B is a view illustrating an example of the substrate processing method according to the first modification.
Figure 5C:
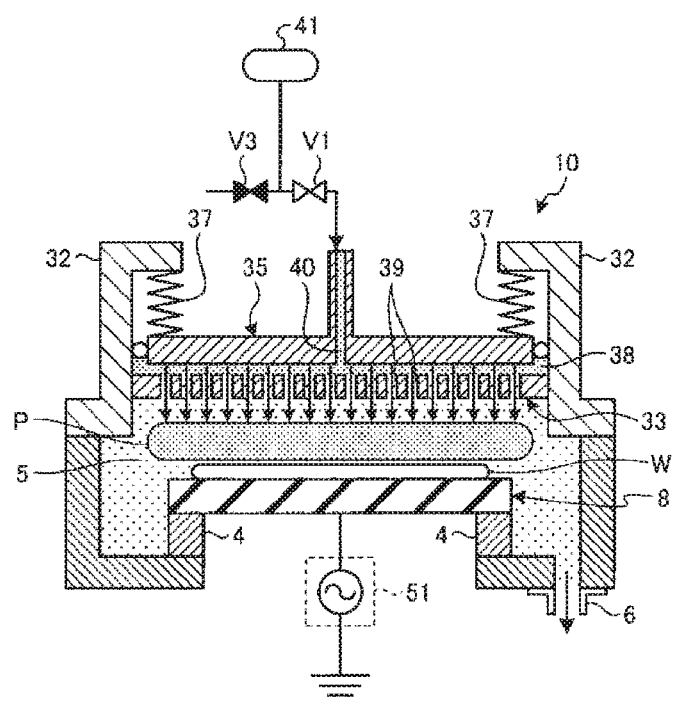
FIG. 5C is a view illustrating an example of the substrate processing method according to the first modification.
Figure 7:
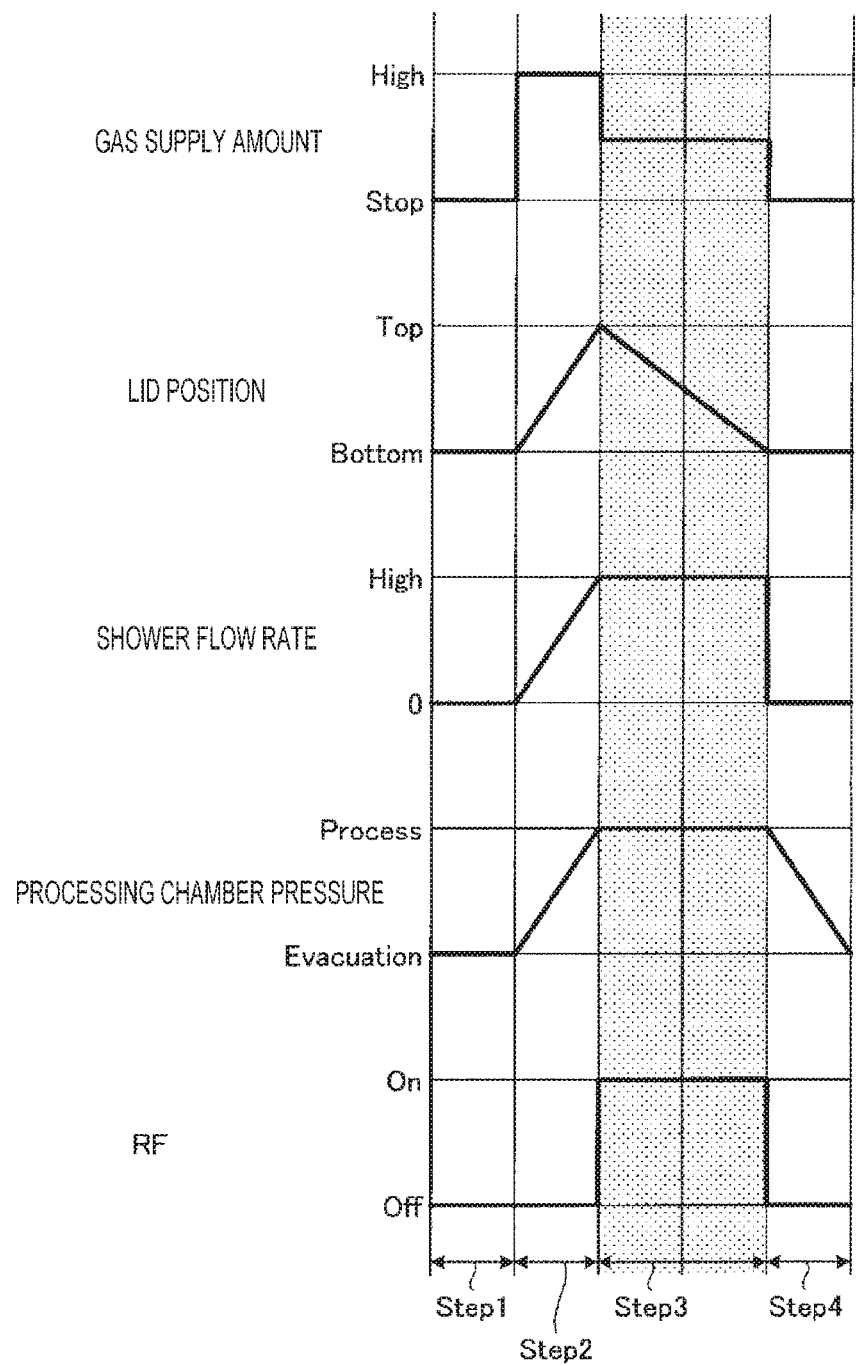
FIG. 7 is a timing chart illustrating an example of the substrate processing method according to the first modification.

Subsequently, a substrate processing method according to a first modification will be described. FIGS. 5A to 5C are views illustrating an example of the substrate processing method according to the first modification. FIGS. 5A to 5C illustrate an example of a case where a processing gas is supplied even when the top plate 35 is lowered in the substrate processing apparatus 10 of the first embodiment. FIG. 6 is a view illustrating an example of an operation state of each part of the substrate processing apparatus according to the first modification. FIG. 7 is a timing chart illustrating an example of the substrate processing method according to the first modification. In FIGS. 6 and 7, a step of a process is denoted by "Step," the top plate 35 is denoted by "Lid," and the radio-frequency power is denoted by "RF." FIGS. 6 and 7 illustrate the valves V1 and V3, the radio-frequency power and the operation state in each step. It is assumed that the processing gas source 41 supplies the gas A. The loading, unloading, and temperature adjustment of the wafer W are the same as in the first embodiment, and explanation thereof will not be repeated.

In the substrate processing method according to the first modification, as illustrated in FIG. 5A, the controller 60 closes the valve V1 and controls the drive device 81 (not illustrated in FIG. 5A) of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIGS. 6 and 7). At this time, the top plate 35 is located at a lower end position (Bottom), the valve V1 is closed, and the valve V3 is opened.

Next, as illustrated in FIG. 5B, when the exhaust is completed, the controller 60 controls the drive device 81 (not illustrated in FIG. 5B) of the top plate 35 to raise the top plate 35. The controller 60 moves the top plate 35 to an upper end position (Top) to increase the volume of the gas diffusion chamber 38. At this time, the controller 60 controls the valve V1 to be opened, the valve V3 to be closed, and the processing gas source 41 to supply the gas A to the gas introduction port 40. The gas A is supplied from the gas introduction port 40 into the gas diffusion chamber 38 and is diffused in the gas diffusion chamber 38. That is, the gas A is charged into the gas diffusion chamber 38 (Step 2 in FIGS. 3 and 4).

Subsequently, as illustrated in FIG. 5C, the controller 60 controls the drive device 81 (not illustrated in FIG. 5C) of the top plate 35 to lower the top plate 35 at a first speed to reduce the volume of the gas diffusion chamber 38. The gas A is supplied into the processing chamber 5 through a plurality of gas supply holes 39. Since the valve V1 is opened, the gas A is continuously supplied.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIGS. 6 and 7). When the process using the gas A is completed, the controller 60 controls the power supply device 51 to stop the supply of the radio-frequency power. Further, the controller controls the valve V1 to be closed and the valve V3 to be opened, so that the supply of the gas A is stopped. That is, as illustrated in FIG. 4, in Step 3, while the supply amount of the gas A from the processing gas source 41 is being adjusted and continuously supplied, the top plate 35 is lowered and the gas A charged in the gas diffusion chamber 38 while supplying the gas A is used to perform a process using the plasma P.

When the volume of the gas diffusion chamber 38 is reduced, the controller 60 controls the exhauster 2 to exhaust the gas A from the processing chamber 5 (Step 4 in FIGS. 6 and 7). At this time, the top plate 35 is located at a lower end position (Bottom), the valve V1 is closed, and the valve V3 is opened. Thereafter, the controller 60 repeats the process such as charging with the gas A, processing with the gas A, and exhausting.

In the first modification, by supplying the processing gas while lowering the top plate 35, the processing gas exceeding the volume of the gas diffusion chamber 38 may be supplied. Further, the exhaust time of the processing gas may be reduced.

[Second Modification]

Figure 10:
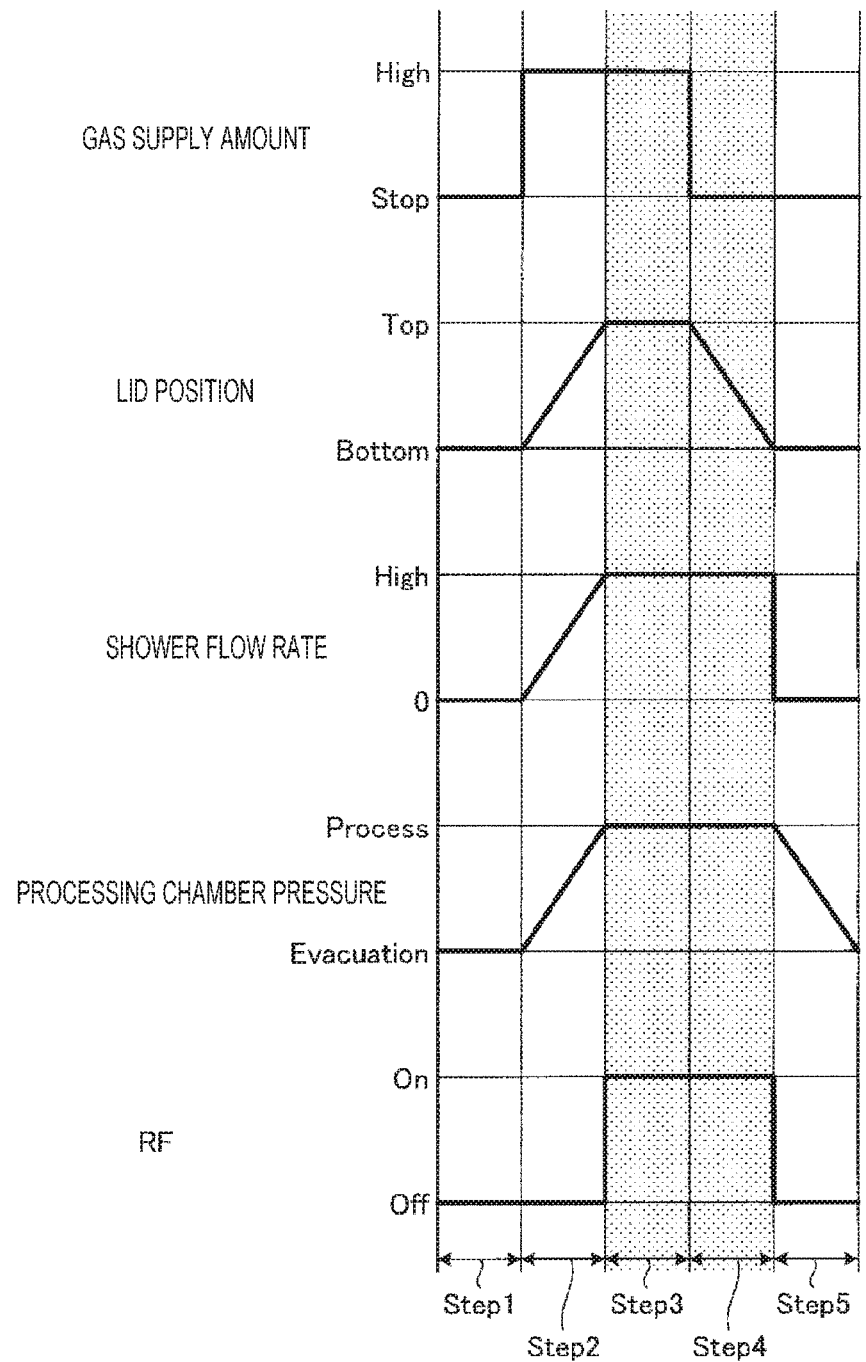
FIG. 10 is a timing chart illustrating an example of the substrate processing method according to the second modification.

Subsequently, a substrate processing method according to a second modification will be described. FIGS. 8A to 8D are views illustrating an example of the substrate processing method according to the second modification. FIGS. 8A to 8D illustrate an example of a case where, in the substrate processing apparatus 10 of the first embodiment, before the top plate 35 is lowered, a process is started by generating the plasma P in a state where the top plate 35 is at the upper end position (Top), the supply of the processing gas is stopped after the lapse of predetermined time, and the lowering of the top plate 35 is started. FIG. 9 is a view illustrating an example of an operation state of each part of the substrate processing apparatus according to the second modification. FIG. 10 is a timing chart illustrating an example of the substrate processing method according to the second modification. In FIGS. 9 and 10, a step of a process is denoted by "Step." the top plate 35 is denoted by "Lid." and the radio-frequency power is denoted by "RF." FIGS. 9 and 10 illustrate the valves V1 and V3, the radio-frequency power and the operation state in each step. It is assumed that the processing gas source 41 supplies the gas A. The loading, unloading, and temperature adjustment of the wafer W are the same as in the first embodiment, and explanation thereof will not be repeated.

Figure 8A:
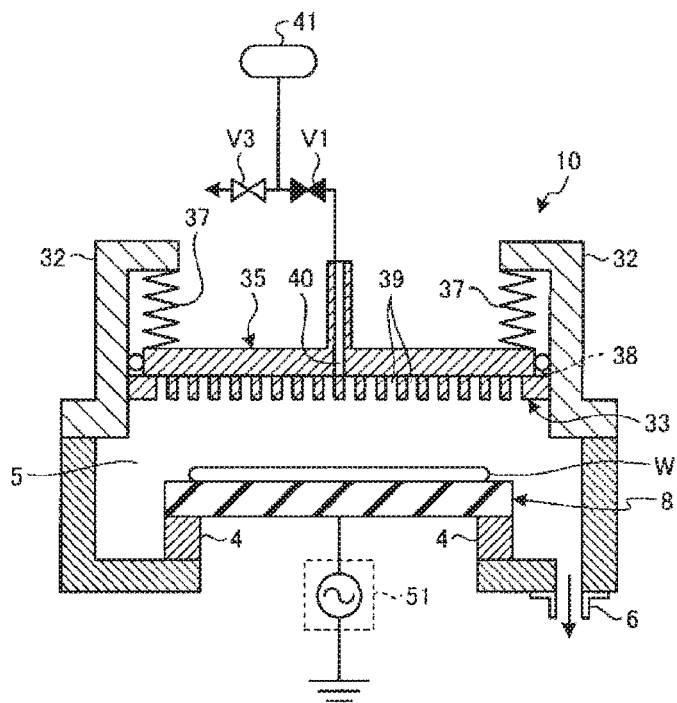
FIG. 8A is a view illustrating an example of a substrate processing method according to a second modification.

In the substrate processing method according to the second modification, as illustrated in FIG. 8A, the controller 60 closes the valve V1 and controls the drive device 81 (not illustrated in FIG. 8A) of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIGS. 9 and 10). At this time, the top plate 35 is located at a lower end position (Bottom), the valve V1 is closed, and the valve V3 is opened.

Figure 8B:
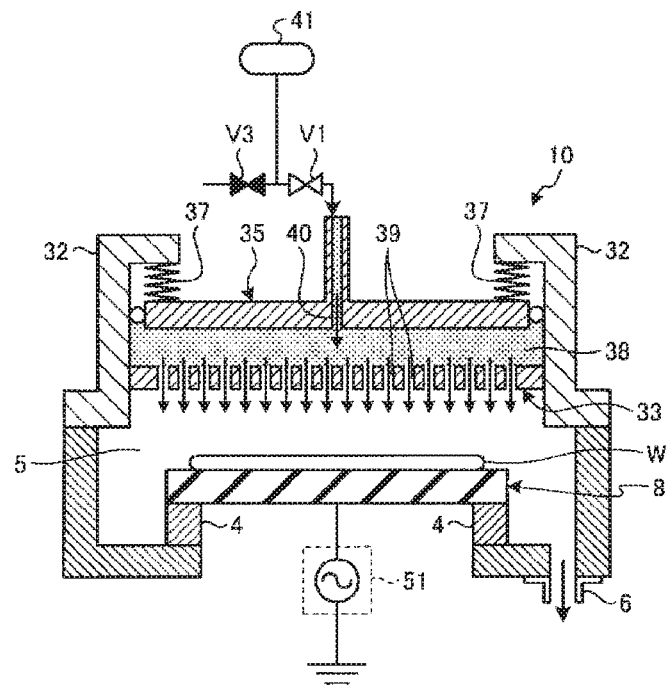
FIG. 8B is a view illustrating an example of the substrate processing method according to the second modification.

Next, as illustrated in FIG. 8B, when the exhaust is completed, the controller 60 controls the drive device 81 (not illustrated in FIG. 8B) of the top plate 35 to raise the top plate 35. The controller 60 moves the top plate 35 to an upper end position (Top) to increase the volume of the gas diffusion chamber 38. At this time, the controller 60 controls the valve V1 to be opened, the valve V3 to be closed, and the processing gas source 41 to supply the gas A to the gas introduction port 40. The gas A is supplied from the gas introduction port 40 into the gas diffusion chamber 38 and is diffused in the gas diffusion chamber 38. That is, the gas A is charged into the gas diffusion chamber 38 (Step 2 in FIGS. 9 and 10). Thereafter, the gas A is supplied into the processing chamber 5 through a plurality of gas supply holes 39.

Figure 8C:
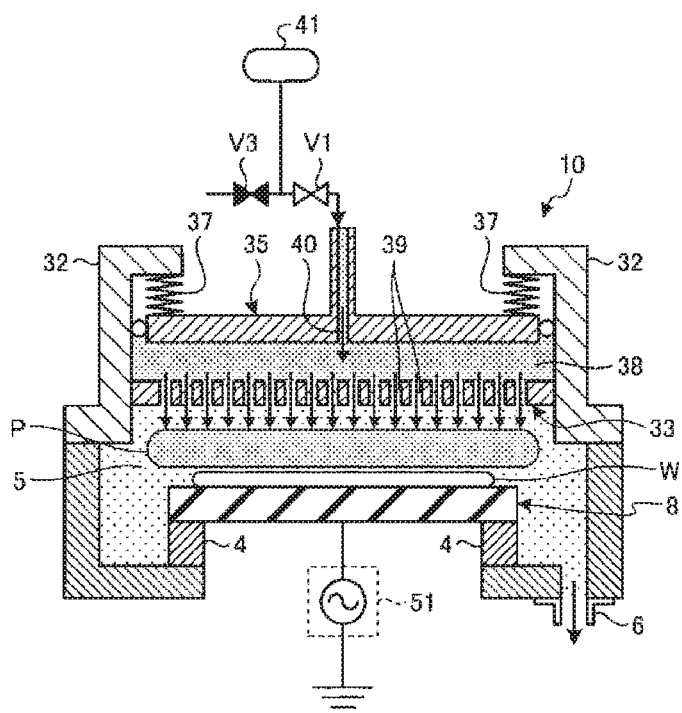
FIG. 8C is a view illustrating an example of the substrate processing method according to the second modification.

Subsequently, as illustrated in FIG. 8C, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIGS. 9 and 10).

Figure 8D:
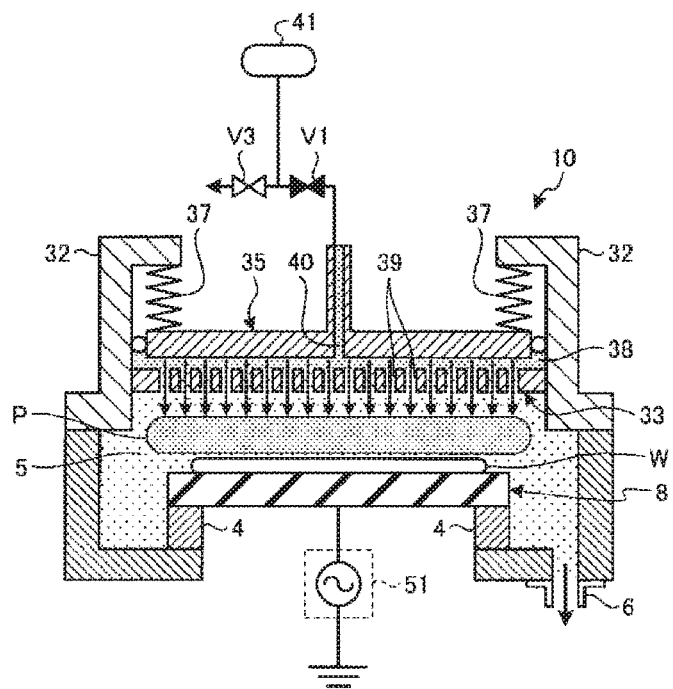
FIG. 8D is a view illustrating an example of the substrate processing method according to the second modification.

Next, as illustrated in FIG. 8D, the controller controls the valve V1 to be closed and the valve V3 to be opened, so that the supply of the gas A is stopped. The controller 60 controls the drive device 81 (not illustrated in FIG. 8D) of the top plate 35 to lower the top plate 35 at a first speed to reduce the volume of the gas diffusion chamber 38. The gas A is supplied into the processing chamber 5 through the plurality of gas supply holes 39. Subsequently, for example, a film is formed on the wafer W by the plasma P (Step 4 in FIGS. 9 and 10). When the process using the gas A is completed, the controller 60 controls the power supply device 51 to stop the supply of the radio-frequency power. That is, as illustrated in FIG. 10, in Step 4, after the supply of the gas A from the processing gas source 41 is stopped, the top plate 35 is lowered and the gas A charged in the gas diffusion chamber 38 is used to perform a process using the plasma P.

When the volume of the gas diffusion chamber 38 is reduced, the controller 60 controls the exhauster 2 to exhaust the gas A from the processing chamber 5 (Step 5 in FIGS. 9 and 10). At this time, the top plate 35 is located at the lower end position (Bottom), the valve V1 is closed, and the valve V3 is opened. Thereafter, the controller 60 repeats the process such as charging with the gas A, processing with the gas A, and exhausting.

In the second modification, since the supply of the processing gas is stopped after the lapse of predetermined time from the start of the plasma processing and the lowering of the top plate 35 is started, the processing gas exceeding the volume of the gas diffusion chamber 38 may be supplied. Further, the exhaust time of the processing gas may be reduced.

Second Embodiment

Figure 13:
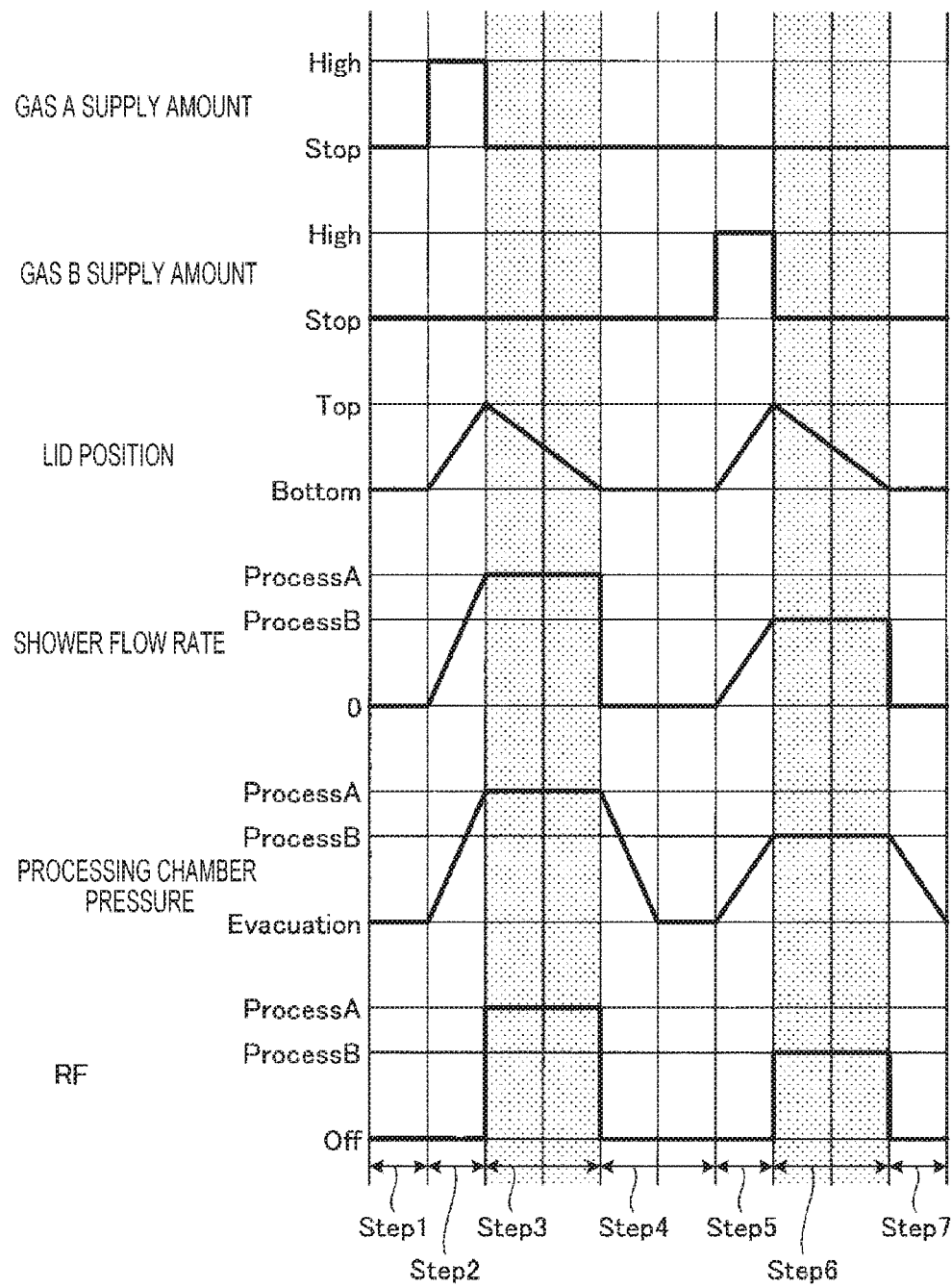
FIG. 13 is a timing chart illustrating an example of the substrate processing method according to the second embodiment.

Next, a substrate processing method according to a second embodiment will be described. In the second embodiment, a case where two types of processing gases are used in the substrate processing apparatus 10 will be described. FIGS. 11A to 11F are views illustrating an example of the substrate processing method according to the second embodiment. FIG. 12 is a view illustrating an example of an operation state of each part of the substrate processing apparatus according to the second embodiment. FIG. 13 is a timing chart illustrating an example of the substrate processing method according to the second embodiment. In FIGS. 12 and 13, a step of a process is denoted by "Step," the top plate 35 is denoted by "Lid," and the radio-frequency power is denoted by "RF." FIGS. 12 and 13 illustrate the valves V1 to V4, the radio-frequency power and the operation state in each step. It is assumed that the processing gas sources 41 and 42 supply the gases A and B, respectively.

Figure 11A:
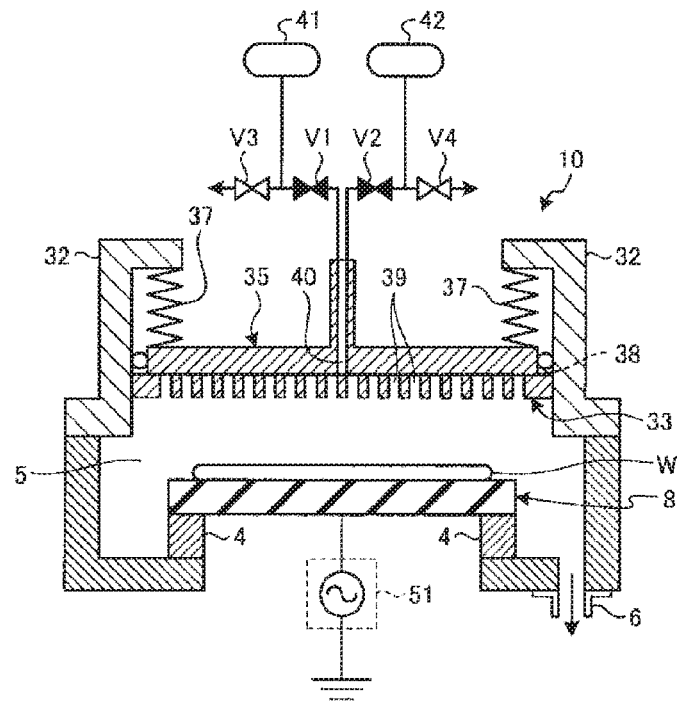
FIG. 11A is a view illustrating an example of a substrate processing method according to a second embodiment.

In the substrate processing method according to the second embodiment, as illustrated in FIG. 11A, the controller 60 closes the valves V1 and V2 and controls the drive device 81 (not illustrated in FIG. 1A) of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIGS. 12 and 13). At this time, the top plate 35 is located at a lower end position (Bottom), the valves V1 and V2 are closed, and the valves V3 and V4 are opened.

Figure 11B:
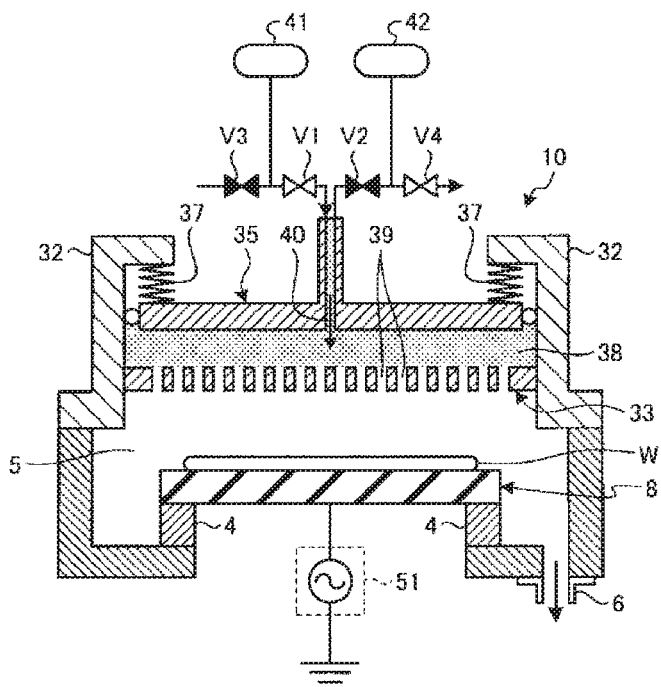
FIG. 11B is a view illustrating an example of the substrate processing method according to the second embodiment.

Subsequently, as illustrated in FIG. 11B, when the exhaust is completed, the controller 60 controls the drive device 81 (not illustrated in FIG. 11B) of the top plate 35 to raise the top plate 35. The controller 60 moves the top plate 35 to an upper end position (Top) to increase the volume of the gas diffusion chamber 38. At this time, the controller 60 controls the valve V1 to be opened, the valve V3 to be closed, and the processing gas source 41 to supply the gas A to the gas introduction port 40. The gas A is supplied from the gas introduction port 40 into the gas diffusion chamber 38 and is diffused in the gas diffusion chamber 38. That is, the gas A is charged into the gas diffusion chamber 38 (Step 2 in FIGS. 12 and 13).

Figure 11C:
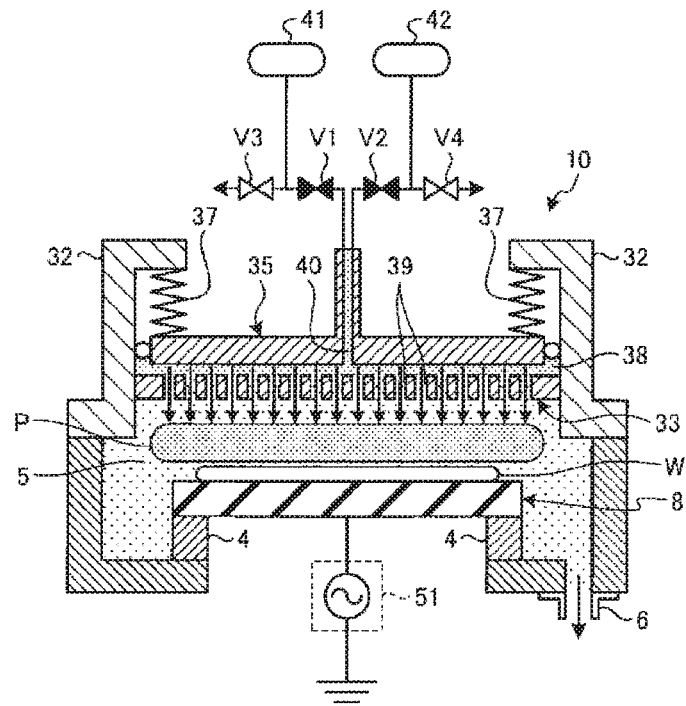
FIG. 11C is a view illustrating an example of the substrate processing method according to the second embodiment.

Next, as illustrated in FIG. 11C, the controller 60 controls the valve V1 to be closed and the valve V3 to be opened, so that the supply of the gas A is stopped. The controller 60 controls the drive device 81 (not illustrated in FIG. 11C) of the top plate 35 to lower the top plate 35 at a first speed to reduce the volume of the gas diffusion chamber 38. The gas A is supplied into the processing chamber 5 through a plurality of gas supply holes 39.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIGS. 12 and 13). When the process using the gas A is completed, the controller 60 controls the power supply device 51 to stop the supply of the radio-frequency power. That is, as illustrated in FIG. 13, in Step 3, after the supply of the gas A from the processing gas source 41 is stopped, the top plate 35 is lowered at the first speed and the gas A charged in the gas diffusion chamber 38 is used to perform a process using the plasma P.

Figure 11D:
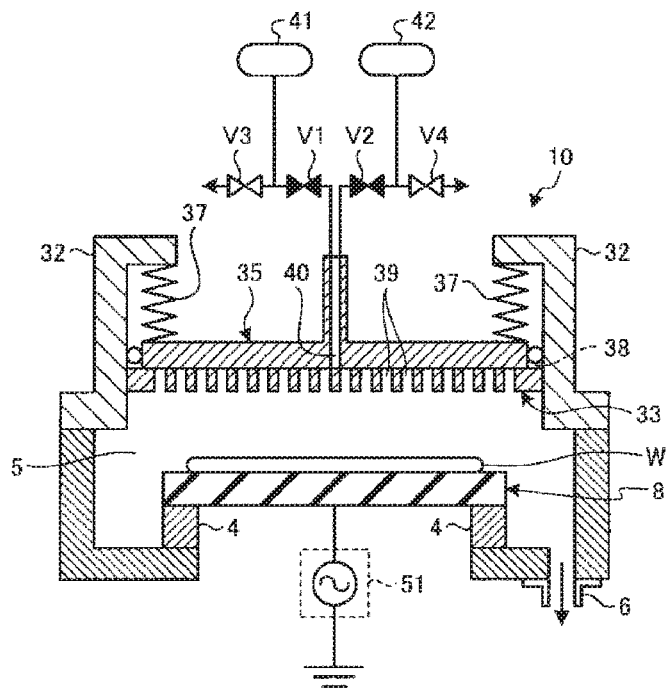
FIG. 11D is a view illustrating an example of the substrate processing method according to the second embodiment.

Subsequently, as illustrated in FIG. 11D, when the volume of the gas diffusion chamber 38 is reduced, the controller 60 controls the exhauster 2 to exhaust the gas A from the processing chamber 5 (Step 4 in FIGS. 12 and 13). At this time, the top plate 35 is located at a lower end position (Bottom), the valves V1 and V2 are closed, and the valves V3 and V4 are opened.

Figure 11E:
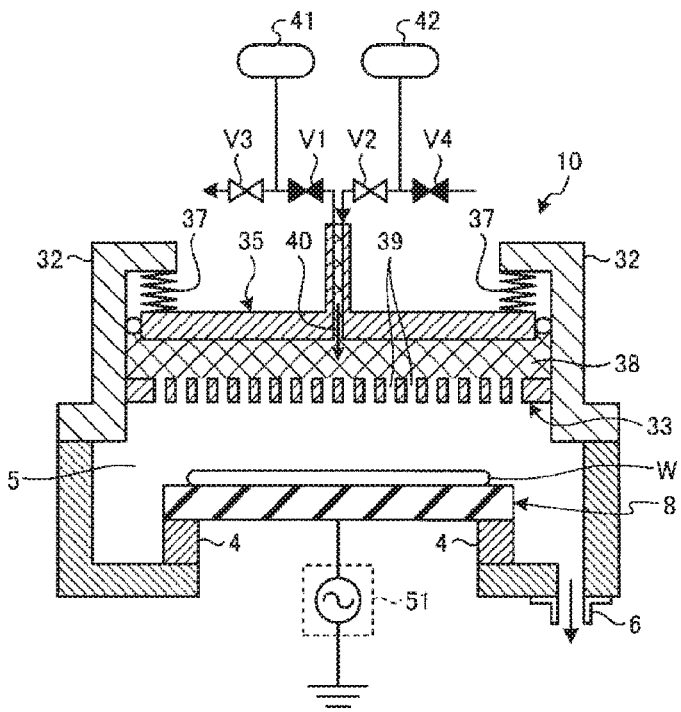
FIG. 11E is a view illustrating an example of the substrate processing method according to the second embodiment.
Figure 11F:
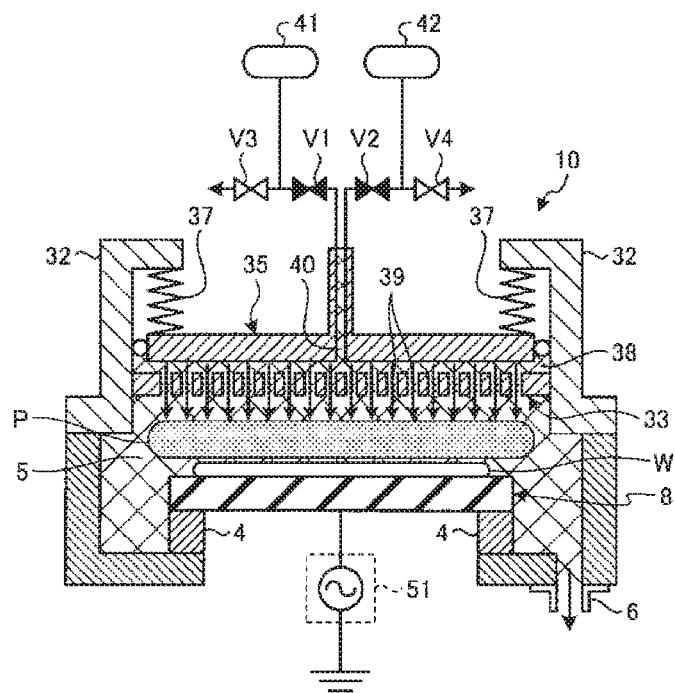
FIG. 11F is a view illustrating an example of the substrate processing method according to the second embodiment.

Next, as illustrated in FIG. 11E, when the exhaust is completed, the controller 60 controls the drive device 81 (not illustrated in FIG. 11E) of the top plate 35 to raise the top plate 35. The controller 60 moves the top plate 35 to the upper end position (Top) to increase the volume of the gas diffusion chamber 38. At this time, the controller 60 controls the valve V2 to be opened, the valve V4 to be closed, and the processing gas source 42 to supply the gas B to the gas introduction port 40. The gas B is supplied from the gas introduction port 40 into the gas diffusion chamber 38 and is diffused in the gas diffusion chamber 38. That is, the gas B is charged into the gas diffusion chamber 38 (Step 5 in FIGS. 12 and 13). The supply amount of the gas B supplied at this time is equal to or smaller than the supply amount of the gas A supplied in Step 2.

Subsequently, as illustrated in FIG. 11E, the controller 60 controls the valve V2 to be closed and the valve V4 to be opened, so that the supply of the gas B is stopped. The controller 60 controls the drive device 81 of the top plate 35 to lower the top plate 35 at a second speed lower than the first speed to reduce the volume of the gas diffusion chamber 38. The gas B is supplied into the processing chamber 5 through a plurality of gas supply holes 39.

At this time, the controller 60 controls the power supply device 51 to supply second power smaller than the first power of the first radio-frequency for plasma excitation to the stage 8. When the first radio-frequency is supplied to the stage 8, plasma P is generated in the processing chamber 5. For example, a film is etched on the wafer W by the plasma P generated in the processing chamber 5 (Step 6 in FIGS. 12 and 13). The second radio-frequency may be supplied to the stage 8 in addition to the first-frequency for etching process. When the process using the gas B is completed, the controller 60 controls the power supply device 51 to stop the supply of the radio-frequency power. That is, as illustrated in FIG. 13, in Step 6, after the supply of the gas B from the processing gas source 42 is stopped, the top plate 35 is lowered and the gas B charged in the gas diffusion chamber 38 is used to perform a process using the plasma P. Further, since the top plate 35 is lowered at the second speed lower than the first speed, the flow rate of the gas B supplied from the gas diffusion chamber 38 into the processing chamber 5 is smaller than the flow rate of the gas A.

When the volume of the gas diffusion chamber 38 is reduced, the controller 60 controls the exhauster 2 to exhaust the gas B from the processing chamber 5 (Step 7 in FIGS. 12 and 13). At this time, the top plate 35 is located at the lower end position (Bottom), the valves V1 and V2 are closed, and the valves V3 and V4 are opened. Thereafter, the controller 60 repeats the process such as charging with the gas A, processing with the gas A, exhausting of the gas A, charging with the gas B, processing with the gas B, and exhausting of the gas B.

In the second embodiment, by controlling the speed of lowering the top plate 35 is lowered, the flow rate of the gas supplied into the processing chamber 5 may be controlled. Further, the exhaust time of the processing gas may be reduced. That is, in the second embodiment, the flow rate of the gas supplied into the processing chamber 5 may be controlled by optimizing the lowering timing and lowering speed of the top plate 35 and the supply amount of the processing gas for each process type.

[Third Modification]

Figure 15:
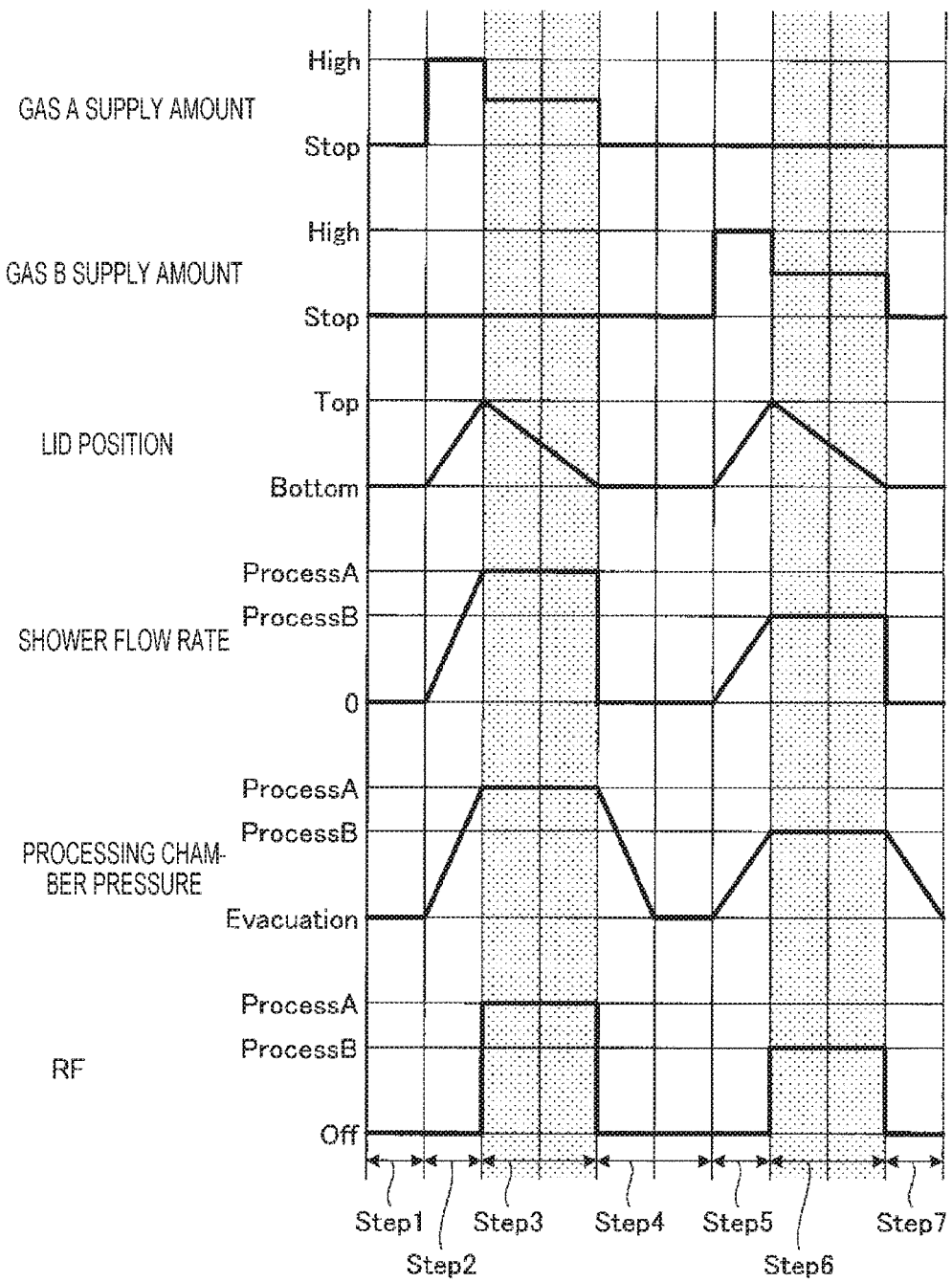
FIG. 15 is a timing chart illustrating an example of a substrate processing method according to the third modification.

Next, a substrate processing method according to a third modification will be described. A case where a processing gas is supplied even when the top plate 35 is lowered in the substrate processing apparatus 10 of the second embodiment. That is, the third modification is an example of a case where the first modification of the first embodiment is applied to the second embodiment. FIG. 14 is a view illustrating an example of an operation state of each part of the substrate processing apparatus according to the third modification. FIG. 15 is a timing chart illustrating an example of the substrate processing method according to the third modification. In FIGS. 14 and 15, a step of a process is denoted by "Step," the top plate 35 is denoted by "Lid," and the radio-frequency power is denoted by "RF." FIGS. 14 and 15 illustrate the valves V1 to V4, the radio-frequency power and the operation state in each step. It is assumed that the processing gas sources 41 and 42 supply the gases A and B, respectively.

In the substrate processing method according to the third modification, the controller 60 closes the valves V1 and V2 and controls the drive device 81 of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIGS. 14 and 15). At this time, the top plate 35 is located at a lower end position (Bottom), the valves V1 and V2 are closed, and the valves V3 and V4 are opened.

Subsequently, when the exhaust is completed, the controller 60 controls the drive device 81 of the top plate 35 to raise the top plate 35. The controller 60 moves the top plate 35 to an upper end position (Top) to increase the volume of the gas diffusion chamber 38. At this time, the controller 60 controls the valve V1 to be opened, the valve V3 to be closed, and the processing gas source 41 to supply the gas A to the gas introduction port 40. The gas A is supplied from the gas introduction port 40 into the gas diffusion chamber 38 and is diffused in the gas diffusion chamber 38. That is, the gas A is charged into the gas diffusion chamber 38 (Step 2 in FIGS. 14 and 15).

Next, the controller 60 controls the drive device 81 of the top plate 35 to lower the top plate 35 at a first speed to reduce the volume of the gas diffusion chamber 38. The gas A is supplied into the processing chamber 5 of the chamber 1 through a plurality of gas supply holes 39. Since the valve V1 is opened, the gas A is continuously supplied.

At this time, the controller 60 controls the power supply device 51 to supply the first power of the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIGS. 14 and 15). When the process using the gas A is completed, the controller 60 controls the power supply device 51 to stop the supply of the radio-frequency power. Further, the controller controls the valve V1 to be closed and the valve V3 to be opened, so that the supply of the gas A is stopped. That is, as illustrated in FIG. 15, in Step 3, while the supply amount of the gas A from the processing gas source 41 is being adjusted and continuously supplied, the top plate 35 is lowered at the first speed and the gas A charged in the gas diffusion chamber 38 using the plasma P while supplying the gas A is used to perform a process.

When the volume of the gas diffusion chamber 38 is reduced, the controller 60 controls the exhauster 2 to exhaust the gas A from the processing chamber 5 (Step 4 in FIGS. 14 and 15). At this time, the top plate 35 is located at the lower end position (Bottom), the valves V1 and V2 are closed, and the valves V3 and V4 are opened.

Next, when the exhaust is completed, the controller 60 controls the drive device 81 of the top plate 35 to raise the top plate 35. The controller 60 moves the top plate 35 to the upper end position (Top) to increase the volume of the gas diffusion chamber 38. At this time, the controller 60 controls the valve V2 to be opened, the valve V4 to be closed, and the processing gas source 42 to supply the gas B to the gas introduction port 40. The gas B is supplied from the gas introduction port 40 into the gas diffusion chamber 38 and is diffused in the gas diffusion chamber 38. That is, the gas B is charged into the gas diffusion chamber 38 (Step 5 in FIGS. 14 and 15).

Subsequently, the controller 60 controls the drive device 81 of the top plate 35 to lower the top plate 35 at a second speed lower than the first speed to reduce the volume of the gas diffusion chamber 38. The gas B is supplied into the processing chamber 5 through a plurality of gas supply holes 39. Since the valve V2 is opened, the gas B is continuously supplied.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is etched on the wafer W by the plasma P generated in the processing chamber 5 (Step 6 in FIGS. 14 and 15). The second radio-frequency may be supplied to the stage 8 in addition to the first-frequency for etching process. The supply amount of the gas B supplied in Step 5 and Step 6 is equal to or smaller than the supply amount of the gas A supplied in Step 2 and Step 3. When the process using the gas B is completed, the controller 60 controls the power supply device 51 to stop the supply of the radio-frequency power. That is, as illustrated in FIG. 15, in Step 6, while the supply amount of the gas B from the processing gas source 42 is being adjusted and continuously supplied, the top plate 35 is lowered and the gas B charged in the gas diffusion chamber 38 while supplying the gas B is used to perform a process using the plasma P. Further, since the top plate 35 is lowered at the second speed lower than the first speed, the flow rate of the gas B supplied from the gas diffusion chamber 38 into the processing chamber 5 is smaller than the flow rate of the gas A.

When the volume of the gas diffusion chamber 38 is reduced, the controller 60 controls the exhauster 2 to exhaust the gas B from the processing chamber 5 (Step 7 in FIGS.

14 and 15). At this time, the top plate 35 is located at the lower end position (Bottom), the valves V1 and V2 are closed, and the valves V3 and V4 are opened. Thereafter, the controller 60 repeats the process such as charging with the gas A, processing with the gas A, exhausting of the gas A, charging with the gas B, processing with the gas B, and exhausting of the gas B.

In the third modification, by supplying the processing gas while lowering the top plate 35, the processing gas exceeding the volume of the gas diffusion chamber 38 may be supplied. Further, the exhaust time of the processing gas may be reduced.

[Fourth Modification]

Figure 17:
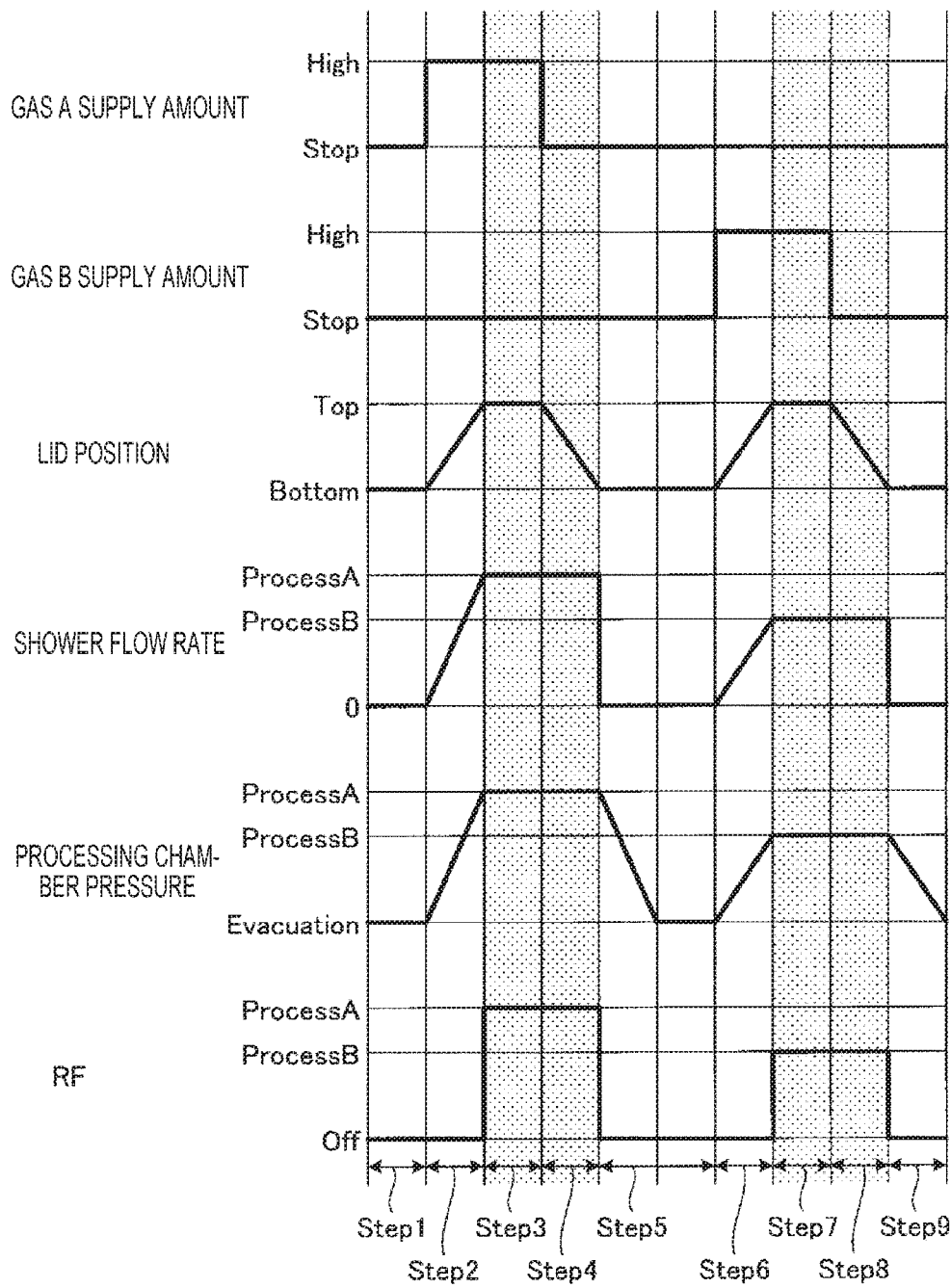
FIG. 17 is a timing chart illustrating an example of a substrate processing method according to the fourth modification.

Next, a substrate processing method according to a fourth modification will be described. In the fourth modification, description will be given of a case where, in the substrate processing apparatus 10 of the second embodiment, before the top plate 35 is lowered, a process is started by generating the plasma P in a state where the top plate 35 is at the upper end position (Top), the supply of the processing gas is stopped after the lapse of predetermined time, and the lowering of the top plate 35 is started. That is, the fourth modification is an example of a case where the second modification of the first embodiment is applied to the second embodiment. FIG. 16 is a view illustrating an example of an operation state of each part of the substrate processing apparatus according to the fourth modification. FIG. 17 is a timing chart illustrating an example of the substrate processing method according to the fourth modification. In FIGS. 16 and 17, a step of a process is denoted by "Step," the top plate 35 is denoted by "Lid," and the radio-frequency power is denoted by "RF." FIGS. 16 and 17 illustrate the valves V1 to V4, the radio-frequency power and the operation state in each step. It is assumed that the processing gas sources 41 and 42 supply the gases A and B, respectively.

In the substrate processing method according to the fourth modification, the controller 60 closes the valves V1 and V2 and controls the drive device 81 of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIGS. 16 and 17). At this time, the top plate 35 is located at a lower end position (Bottom), the valves V1 and V2 are closed, and the valves V3 and V4 are opened.

Subsequently, when the exhaust is completed, the controller 60 controls the drive device 81 of the top plate 35 to raise the top plate 35. The controller 60 moves the top plate 35 to an upper end position (Top) to increase the volume of the gas diffusion chamber 38. At this time, the controller 60 controls the valve V1 to be opened, the valve V3 to be closed, and the processing gas source 41 to supply the gas A to the gas introduction port 40. The gas A is supplied from the gas introduction port 40 into the gas diffusion chamber 38 and is diffused in the gas diffusion chamber 38. That is, the gas A is charged into the gas diffusion chamber 38 (Step 2 in FIGS. 16 and 17). Thereafter, the gas A is supplied into the processing chamber 5 through a plurality of gas supply holes 39.

Next, the controller 60 controls the power supply device 51 to supply the first power of the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIGS. 16 and 17).

Subsequently, the controller controls the valve V1 to be closed and the valve V3 to be opened, so that the supply of the gas A is stopped. The controller 60 controls the drive device 81 of the top plate 35 to lower the top plate 35 at a first speed to reduce the volume of the gas diffusion chamber 38. The gas A is supplied into the processing chamber 5 of the chamber 1 through the plurality of gas supply holes 39 and is charged into the processing chamber 5. Subsequently, for example, a film is formed on the wafer W by the plasma P (Step 4 in FIGS. 16 and 17). When the process using the gas A is completed, the controller 60 controls the power supply device 51 to stop the supply of the radio-frequency power. That is, as illustrated in FIG. 17, in Step 4, after the supply of the gas A from the processing gas source 41 is stopped, the top plate 35 is lowered at the first speed and the gas A charged in the gas diffusion chamber 38 is used to perform a process using the plasma P.

When the volume of the gas diffusion chamber 38 is reduced, the controller 60 controls the exhauster 2 to exhaust the gas A from the processing chamber 5 (Step 5 in FIGS. 16 and 17). At this time, the top plate 35 is located at the lower end position (Bottom), the valves V1 and V2 are closed, and the valves V3 and V4 are opened.

Next, when the exhaust is completed, the controller 60 controls the drive device 81 of the top plate 35 to raise the top plate 35. The controller 60 moves the top plate 35 to the upper end position (Top) to increase the volume of the gas diffusion chamber 38. At this time, the controller 60 controls the valve V2 to be opened, the valve V4 to be closed, and the processing gas source 42 to supply the gas B to the gas introduction port 40. The gas B is supplied from the gas introduction port 40 into the gas diffusion chamber 38 and is diffused in the gas diffusion chamber 38. That is, the gas B is charged into the gas diffusion chamber 38 (Step 6 in FIGS. 16 and 17). Thereafter, the gas B is supplied into the processing chamber 5 through the plurality of gas supply holes 39.

Subsequently, the controller 60 controls the power supply device 51 to supply second power smaller than the first power of the first radio-frequency for plasma excitation to the stage 8. When the first radio-frequency is supplied to the stage 8, plasma P is generated in the processing chamber 5. For example, a film is etched on the wafer W by the plasma P generated in the processing chamber 5 (Step 7 in FIGS. 16 and 17). The second radio-frequency may be supplied to the stage 8 in addition to the first-frequency for etching process.

Next, the controller controls the valve V2 to be closed and the valve V4 to be opened, so that the supply of the gas B is stopped. The controller 60 controls the drive device 81 of the top plate 35 to lower the top plate 35 at a second speed lower than the first speed to reduce the volume of the gas diffusion chamber 38. The gas B is supplied into the processing chamber 5 through the plurality of gas supply holes 39. The supply amount of the gas B supplied in Step 6 and Step 7 is equal to or smaller than the supply amount of the gas A supplied in Step 2 and Step 3. Subsequently, for example, a film is etched on the wafer W by the plasma P (Step 8 in FIGS. 16 and 17). The second radio-frequency may be supplied to the stage 8 in addition to the first-frequency for etching process. When the process using the gas B is completed, the controller 60 controls the power supply device 51 to stop the supply of the radio-frequency power. That is, as illustrated in FIG. 17, in Step 8, after the supply of the gas B from the processing gas source 42 is stopped, the top plate 35 is lowered and the gas B charged in the gas diffusion chamber 38 is used to perform a process using the plasma P. Further, since the top plate 35 is lowered at the second speed lower than the first speed, the flow rate of the gas B supplied from the gas diffusion chamber 38 into the processing chamber 5 is smaller than the flow rate of the gas A.

When the volume of the gas diffusion chamber 38 is reduced, the controller 60 controls the exhauster 2 to exhaust the gas B from the processing chamber 5 (Step 9 in FIGS. 16 and 17). At this time, the top plate 35 is located at the lower end position (Bottom), the valves V1 and V2 are closed, and the valves V3 and V4 are opened. Thereafter, the controller 60 repeats the process such as charging with the gas A, processing with the gas A, exhausting of the gas A, charging with the gas B, processing with the gas B, and exhausting of the gas B.

In the fourth modification, since the supply of the processing gas is stopped after the lapse of predetermined time from the start of the plasma processing and the lowering of the top plate 35 is started, the processing gas exceeding the volume of the gas diffusion chamber 38 may be supplied. Further, the exhaust time of the processing gas may be reduced.

Third Embodiment

Figure 18:
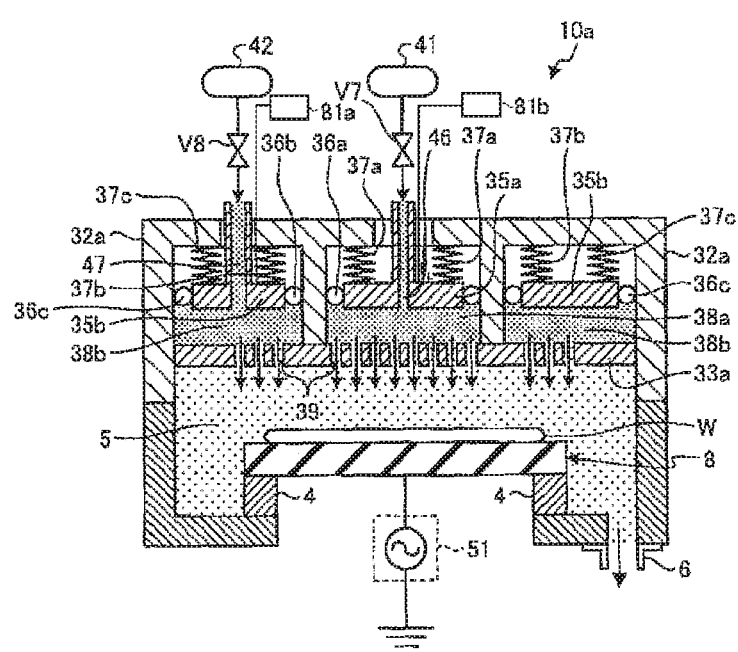
FIG. 18 is a view illustrating an example of a substrate processing apparatus according to a third embodiment.

The gas diffusion chamber 38 may be divided into a plurality of regions, for example, a central portion and a peripheral portion, and its volume may be changed by a corresponding top plate. FIG. 18 is a view illustrating an example of a substrate processing apparatus according to a third embodiment. FIG. 18 illustrates an example of a substrate processing apparatus 10a in which the gas diffusion chamber 38 of the substrate processing apparatus 10 is divided into a first gas diffusion chamber 38a having a top plate 35a at a central portion and a second gas diffusion chamber 38b having a top plate 35b at a peripheral portion. In the substrate processing apparatus 10a, the same components as those of the substrate processing apparatus 10 are denoted by the same reference numerals, and explanation about the configurations and operations thereof will not be repeated.

A top plate support 32a is made of, for example, aluminum. The outer peripheral portion of the top plate support 32a is formed in a cylindrical shape to be able to be disposed on the upper portion of the side wall of the chamber 1, and its surface is anodized. The central portion of the top plate support 32a is formed in a cylindrical shape to correspond to the central portion of a shower plate 33a, and its surface is anodized. The top plate support 32a is connected to the top plates 35a and 35b via bellows 37a and bellows 37b and 37c.

The shower plate 33a is made of a conductive material and is formed in a disc shape. The shower plate 33a is disposed to face the stage 8 such that the lower surface of the shower plate 33a is substantially parallel to the upper surface of the stage 8. The shower plate 33a is further disposed to close an opening formed in the ceiling of the chamber 1. The shower plate 33a is supported by the chamber 1 via the top plate support 32a such that the shower plate 33a and the chamber 1 are electrically interconnected.

The top plates 35a and 35b are made of a conductive material, the top plate 35a is formed in a disc shape, and the top plate 35b is formed in a doughnut shape which is concentric with the top plate 35a. The top plates 35a and 35b are disposed to face the shower plate 33a such that the lower surfaces of the top plates 35a and 35b is substantially parallel to the upper surface of the shower plate 33a. The top plates 35a and 35b have drive devices 81a and 81b, respectively. A seal members 36a, 36b and 36c move together with the top plates 35a and 35b when the top plates 35a and 35b are moved up and down while maintaining the airtightness between the top plate support 32a and the peripheral edges of the top plates 35a and 35b, respectively. The top plates 35a and 35b form a first gas diffusion chamber 38a and a second gas diffusion chamber 38b together with the top plate support 32a, the shower plate 33a, and the seal members 36a, 36b and 36c.

The bellows 37a, 37b and 37c are formed to be extendable and contractible. The bellows 37a, 37b and 37c connect a flange portion installed on the upper portion of the top plate support 32a, and the upper surfaces of the top plates 35a and 35b, respectively. The top plates 35a and 35b are moved up and down by the drive devices 81a and 81b. That is, in the substrate processing apparatus 10a, the volumes of the first gas diffusion chamber 38a and the second gas diffusion chamber 38b may be changed by vertically moving the top plates 35a and 35b, respectively.

The shower plate 33a has a plurality of gas supply holes 39 formed to communicate the processing chamber 5 with the first gas diffusion chamber 38a or the second gas diffusion chamber 38b. A gas introduction port 46 is formed at the center of the top plate 35a and communicates with the first gas diffusion chamber 38a. A gas introduction port 47 is formed at the center of the top plate 35b in the radial direction and communicates with the second gas diffusion chamber 38b.

In the substrate processing apparatus 10a, processing gas sources 41 and 42 are connected to the gas introduction ports 46 and 47 via their respective gas pipes having valves V7 and V8 and their respective gas introduction pipes. That is, the gas introduction pipes have a first gas introduction pipe for introducing a gas into the first gas diffusion chamber 38a and a second gas introduction pipe for introducing a gas into the second gas diffusion chamber 38b. The processing gas source 41 and the first gas introduction pipe are interconnected via the first gas pipe having the valve V7. The first gas introduction pipe is connected to the gas introduction port 46. The processing gas source 42 and the second gas introduction pipe are interconnected via the second gas pipe having the valve V8. The second gas introduction pipe is connected to the gas introduction port 47.

The processing gas sources 41 and 42 supply a predetermined processing gas to the gas introduction ports 46 and 47. In the substrate processing apparatus 10a, for example, processing gases of the same type but different concentrations are supplied from the processing gas sources 41 and 42 into the first gas diffusion chamber 38a and the second gas diffusion chamber 38b, respectively. In addition, in the substrate processing apparatus 10a, different types of processing gases may be supplied into the first gas diffusion chamber 38a and the second gas diffusion chamber 38b, respectively. That is, the substrate processing apparatus 10a may simultaneously supply a plurality of processing gases into the processing chamber 5.

Figure 19:
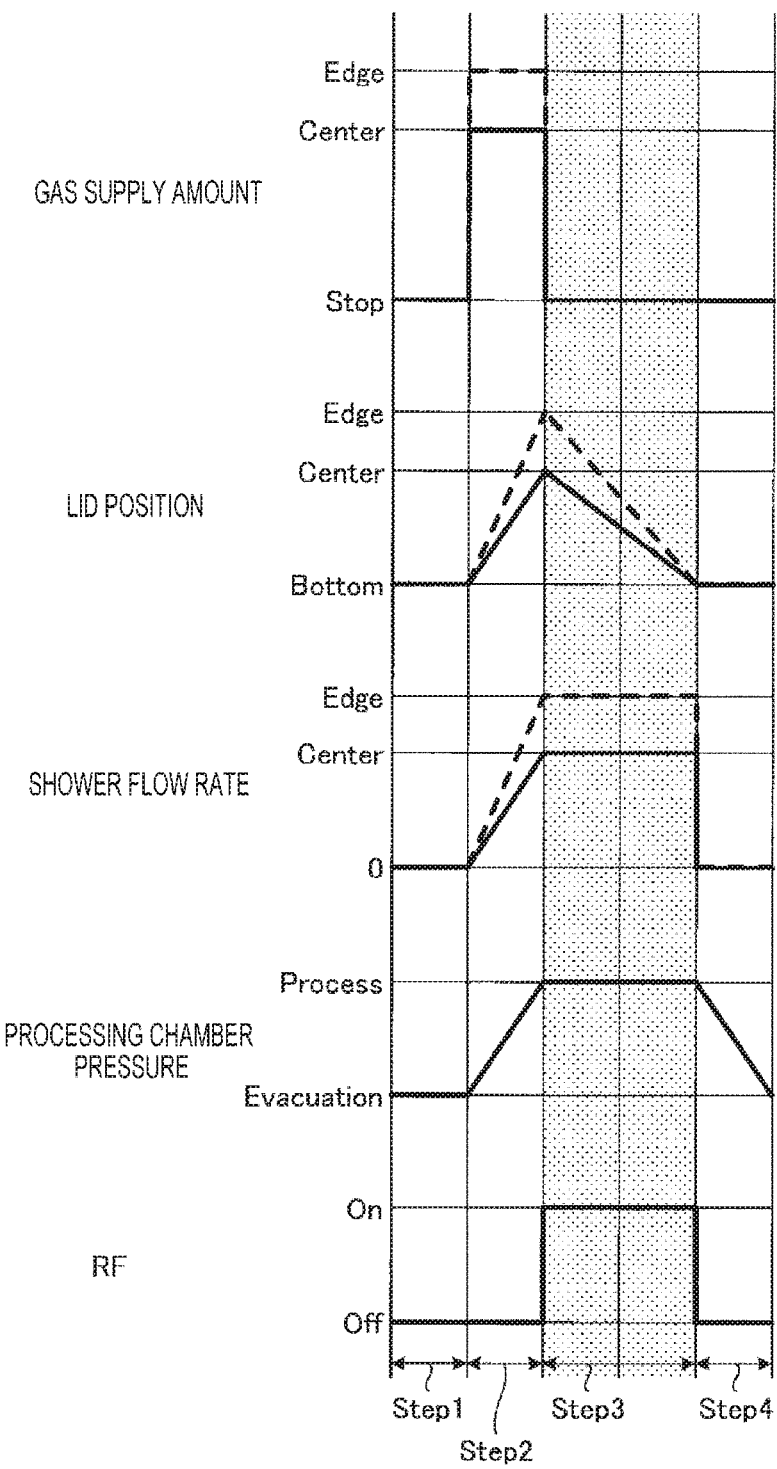
FIG. 19 is a timing chart illustrating an example of a substrate processing method according to the third embodiment.

Next, a substrate processing method according to the third embodiment will be described. FIG. 19 is a timing chart illustrating an example of the substrate processing method according to the third embodiment. FIG. 19 illustrates an example in which the same processing pattern as that of the first embodiment is applied to the substrate processing apparatus 10a of the third embodiment. In FIG. 19, a step of a process is denoted by "Step," the top plates 35a and 35b are denoted by "Lid," and the radio-frequency power is denoted by "RF." FIG. 19 illustrates the operation state in each step. In the graph of FIG. 19, "Center" and "Edge" correspond to the top plates 35*a* and 35*b*, respectively. It is assumed that the processing gas sources 41 and 42 supply the gas A and the gas B, respectively. The loading, unloading, and temperature adjustment of the wafer W are the same as in the first embodiment, and explanation thereof will not be repeated.

In the substrate processing method according to the third embodiment, the controller 60 closes the valves V7 and V8 and controls the drive devices 81*a* and 81*b* of the top plates 35*a* and 35*b* to lower the top plates 35*a* and 35*b* to reduce the volumes of the first gas diffusion chamber 38*a* and the second gas diffusion chamber 38*b*, respectively. When the opening 7 is closed and the volumes of the first gas diffusion chamber 38*a* and the second gas diffusion chamber 38*b* are reduced, the controller 60 controls the exhauster 2 to exhaust a gas from the processing chamber 5 through the exhaust port 6 such that the atmosphere of the processing chamber 5 has a predetermined degree of vacuum (Step 1 in FIG. 19). At this time, the top plates 35*a* and 35*b* are located at a lower end position (Bottom), the valves V7 and V8 are closed.

Next, when the exhaust is completed, the controller 60 controls the drive devices 81*a* and 81*b* of the top plates 35*a* and 35*b* to raise the top plates 35*a* and 35*b*. The controller 60 raises the top plates 35*a* and 35*b* to increase the volumes of the first gas diffusion chamber 38*a* and the second gas diffusion chamber 38*b*, respectively. At this time, the top plate 35*b* is raised to a position higher than the top plate 35*a*. Further, the controller 60 controls the valves V7 and V8 to be opened and the processing gas sources 41 and 42 to supply the gas A and the gas B to the gas introduction ports 46 and 47, respectively. The gas A is supplied from the gas introduction port 46 into the first gas diffusion chamber 38*a* and is diffused in the first gas diffusion chamber 38*a*. That is, the gas A is charged in the first gas diffusion chamber 38*a*. Further, the gas B is supplied from the gas introduction port 47 into the second gas diffusion chamber 38*b* and is diffused in the second gas diffusion chamber 38*b*. That is, the gas B is charged in the second gas diffusion chamber 38*b* (Step 2 in FIG. 19). The supply amount of the gas B supplied at this time is larger than the supply amount of the gas A.

Subsequently, the controller 60 controls the valves V7 and V8 to be closed, so that the supply of the gas A and the gas B is stopped. The controller 60 controls the drive devices 81*a* and 81*b* of the top plates 35*a* and 35*b* to lower the top plate 35*a* at a first speed and lower the top plate 35*b* at a second speed higher than the first speed to reduce the volumes of the first gas diffusion chamber 38*a* and the second gas diffusion chamber 38*b*. The first speed and the second speed are set such that the top plates 35*a* and 35*b* are simultaneously located at the lower end position (Bottom). The gas A and the gas B are supplied into the processing chamber 5 through the plurality of gas supply holes 39. The gas A is supplied to the center side of the wafer W, the gas B is supplied to the outer peripheral side of the wafer W.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIG. 19). When a process using the gas A and the gas B is completed, the controller 60 controls the power supply device 51 to stop the supply of the radio-frequency power. That is, in Step 3, after the supply of the gas A and the gas B from the processing gas sources 41 and 42 is stopped, the top plates 35*a* and 35*b* are lowered, and the gas A charged in the first gas diffusion chamber 38*a* and the gas B charged in the second gas diffusion chamber 38*b* are used to perform a process using the plasma P. Further, since the top plate 35*b* is lowered at a higher speed than the top plate 35*a* and/or the amount of the gas B charged in the second gas diffusion chamber 38*b* is larger than the amount of the gas A charged in the first gas diffusion chamber 38*a*, the flow rate of the gas B supplied to the outer peripheral side of the wafer W is larger than the flow rate of the gas A supplied to the central side of the wafer W.

When the volumes of the first gas diffusion chamber 38*a* and the second gas diffusion chamber 38*b* are reduced, the controller 60 controls the exhauster 2 to exhaust the gas A and the gas B from the processing chamber 5 (Step 4 in FIG. 19). At this time, the top plates 35*a* and 35*b* are located at the lower end position (Bottom), and the valves V7 and V8 are closed. Thereafter, the controller 60 repeats the process such as charging with the gas A and the gas B, processing with the gas A and the gas B, and exhausting.

In the third embodiment, by controlling the speed of lowering the top plates 35*a* and 35*b*, the flow rates of the gas A and the gas B supplied into the processing chamber 5 may be controlled. Further, the exhaust time of the processing gas may be reduced. That is, in the third embodiment, the in-plane distribution of the processing performance may be actively controlled by the amount of supply of gas into each of the first gas diffusion chamber 38*a* and the second gas diffusion chamber 38*b* and the lowering timing and lowering speed of the top plates 35*a* and 35*b*.

[Fifth Modification]

Figure 20:
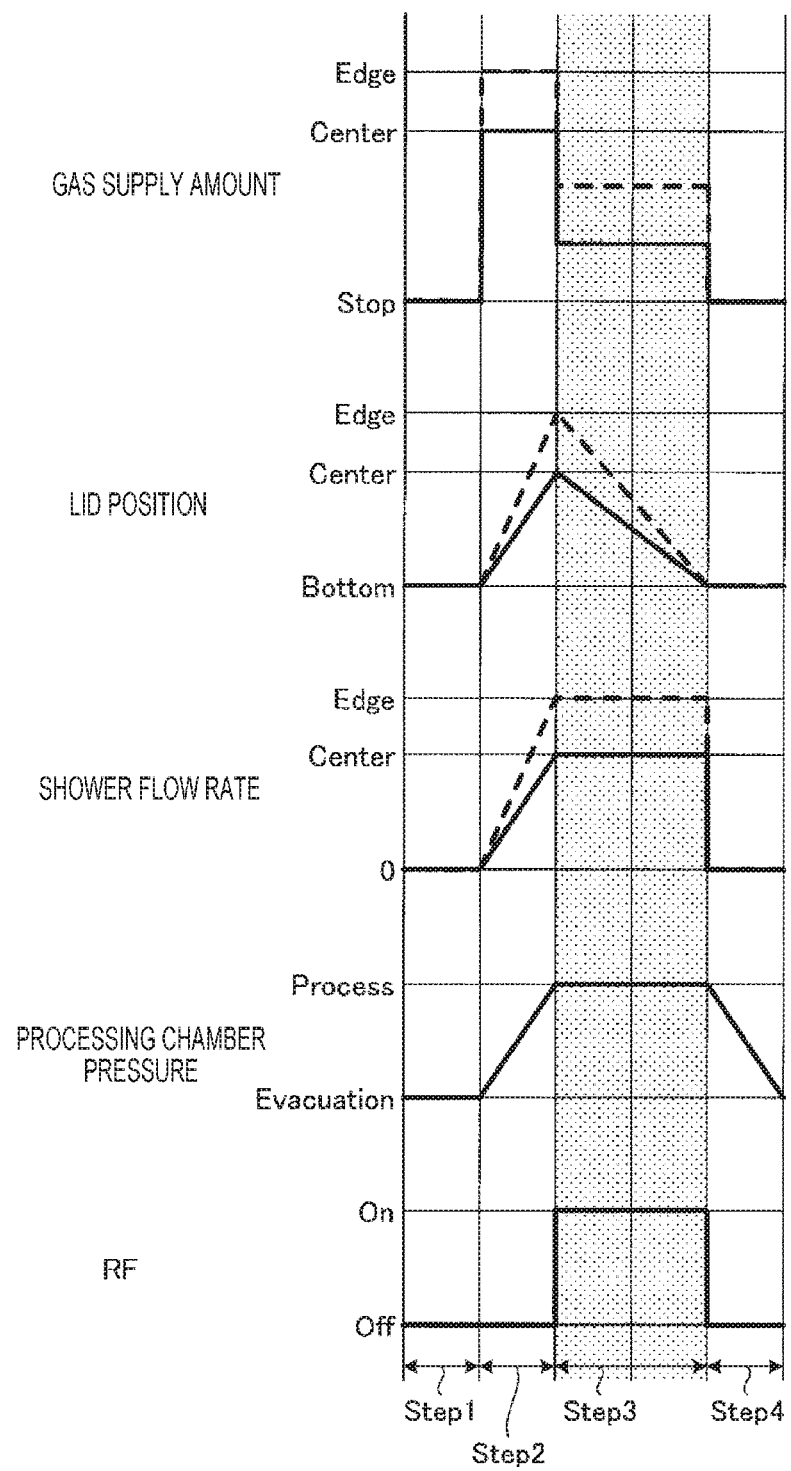
FIG. 20 is a timing chart illustrating an example of a substrate processing method according to a fifth modification.

Subsequently, a substrate processing method according to a fifth modification will be described. FIG. 20 is a timing chart illustrating an example of the substrate processing method according to the fifth modification. FIG. 20 illustrates an example of a case where the same processing pattern as the first modification of the first embodiment is applied to the substrate processing apparatus 10*a* of the third embodiment. In FIG. 20, a step of a process is denoted by "Step," the top plates 35*a* and 35*b* are denoted by "Lid," and the radio-frequency power is denoted by "RF." FIG. 20 illustrates the operation state in each step. In the graph of FIG. 20, "Center" and "Edge" correspond to the top plates 35*a* and 35*b*, respectively. It is assumed that the processing gas sources 41 and 42 supply the gas A and the gas B, respectively. The loading, unloading, and temperature adjustment of the wafer W are the same as in the first embodiment, and explanation thereof will not be repeated.

In the substrate processing method according to the fifth embodiment, the controller 60 closes the valves V7 and V8 and controls the drive devices 81*a* and 81*b* of the top plates 35*a* and 35*b* to lower the top plates 35*a* and 35*b* to reduce the volumes of the first gas diffusion chamber 38*a* and the second gas diffusion chamber 38*b*, respectively. When the opening 7 is closed and the volumes of the first gas diffusion chamber 38*a* and the second gas diffusion chamber 38*b* are reduced, the controller 60 controls the exhauster 2 to exhaust a gas from the processing chamber 5 through the exhaust port 6 such that the atmosphere of the processing chamber 5 has a predetermined degree of vacuum (Step 1 in FIG. 20). At this time, the top plates 35*a* and 35*b* are located at a lower end position (Bottom), the valves V7 and V8 are closed.

Next, when the exhaust is completed, the controller 60 controls the drive devices 81*a* and 81*b* of the top plates 35*a* and 35*b* to raise the top plates 35*a* and 35*b*. The controller 60 raises the top plates 35*a* and 35*b* to increase the volumes of the first gas diffusion chamber 38*a* and the second gas diffusion chamber 38*b*, respectively. At this time, the top plate 35b is raised to a position higher than the top plate 35a. Further, the controller 60 controls the valves V7 and V8 to be opened and the processing gas sources 41 and 42 to supply the gas A and the gas B to the gas introduction ports 46 and 47, respectively. The gas A is supplied from the gas introduction port 46 into the first gas diffusion chamber 38a and is diffused in the first gas diffusion chamber 38a. That is, the gas A is charged in the first gas diffusion chamber 38a. Further, the gas B is supplied from the gas introduction port 47 into the second gas diffusion chamber 38b and is diffused in the second gas diffusion chamber 38b. That is, the gas B is charged in the second gas diffusion chamber 38b (Step 2 in FIG. 20).

Subsequently, the controller 60 controls the drive devices 81a and 81b of the top plates 35a and 35b to lower the top plate 35a at a first speed and lower the top plate 35b at a second speed higher than the first speed to reduce the volumes of the first gas diffusion chamber 38a and the second gas diffusion chamber 38b. The first speed and the second speed are set such that the top plates 35a and 35b are simultaneously located at the lower end position (Bottom). The gas A and the gas B are supplied into the processing chamber 5 through the plurality of gas supply holes 39. The gas A is supplied to the center side of the wafer W, the gas B is supplied to the outer peripheral side of the wafer W. Since the valves V7 and V8 are opened, the gas A and the gas B are continuously supplied.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIG. 20). The supply amount of the gas B supplied in Step 2 and Step 3 is larger than the supply amount of the gas A. When a process using the gas A and the gas B is completed, the controller 60 controls the power supply device 51 to stop the supply of the radio-frequency power. Further, the controller 60 controls the valves V7 and V8 to be closed, so that the supply of the gas A and the gas B is stopped. That is, in Step 3, while the supply amounts of the gas A and the gas B from the processing gas sources 41 and 52 are being adjusted and continuously supplied, the top plates 35a and 35b are lowered. Thereby, in Step 3, the gas A and the gas B charged in the first gas diffusion chamber 38a and the second gas diffusion chamber 38b while supplying the gas A and the gas B are used to perform a process using the plasma P. Further, since the top plate 35b is lowered at a higher speed than the top plate 35a and/or the amount of the gas B charged in the second gas diffusion chamber 38b is larger than the amount of the gas A charged in the first gas diffusion chamber 38a, the flow rate of the gas B supplied to the outer peripheral side of the wafer W is larger than the flow rate of the gas A supplied to the central side of the wafer W.

When the volumes of the first gas diffusion chamber 38a and the second gas diffusion chamber 38b are reduced, the controller 60 controls the exhauster 2 to exhaust the gas A and the gas B from the processing chamber 5 (Step 4 in FIG. 20). At this time, the top plates 35a and 35b are located at the lower end position (Bottom), and the valves V7 and V8 are closed. Thereafter, the controller 60 repeats the process such as charging with the gas A and the gas B, processing with the gas A and the gas B, and exhausting.

In the fifth embodiment, by supplying the processing gas while lowering the top plates 35a and 35b, the processing gas exceeding the volumes of the first gas diffusion chamber 38a and the second gas diffusion chamber 38b may be supplied. Further, the exhaust time of the processing gas may be reduced.

[Sixth Modification]

Figure 21:
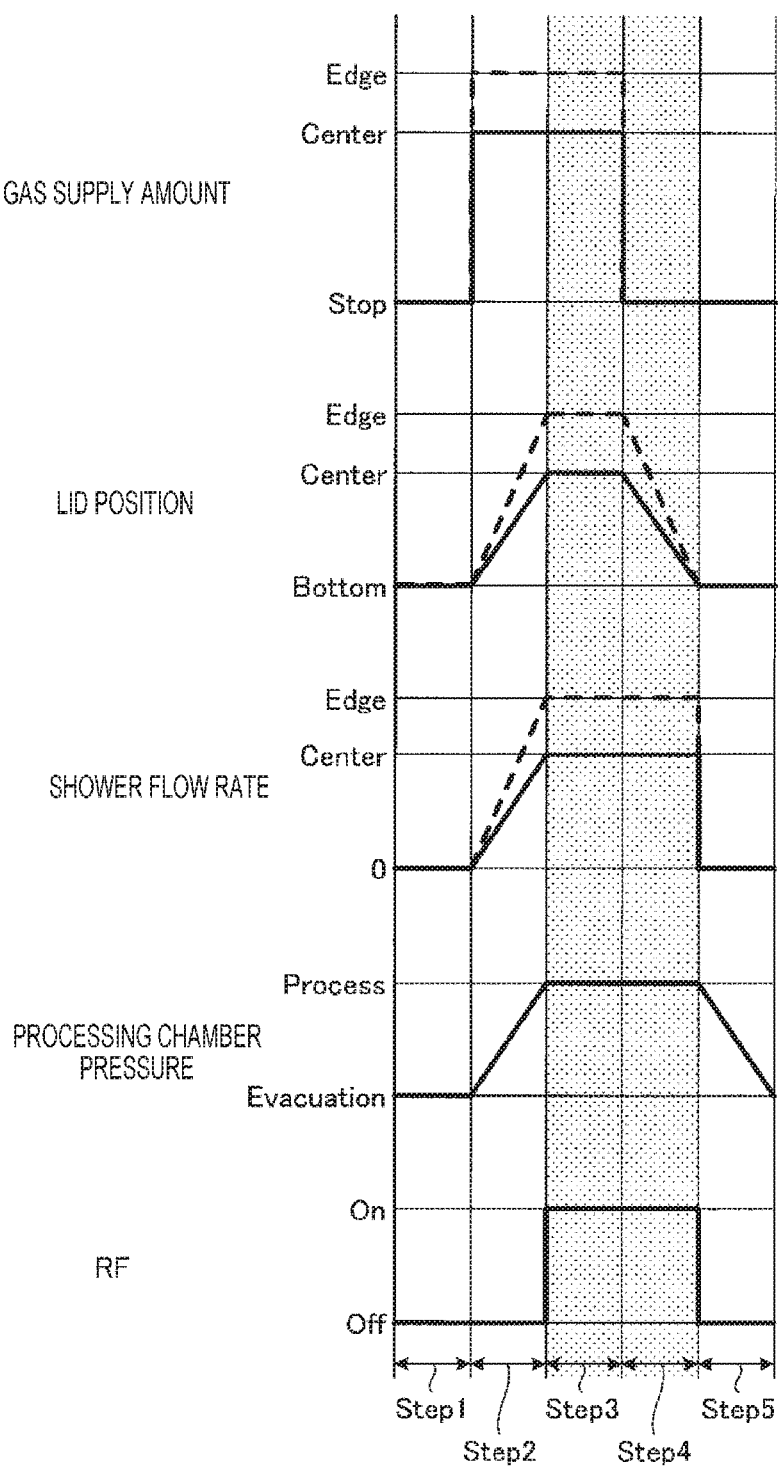
FIG. 21 is a timing chart illustrating an example of a substrate processing method according to a sixth modification.

Subsequently, a substrate processing method according to a sixth modification will be described. FIG. 21 is a timing chart illustrating an example of the substrate processing method according to the sixth modification. FIG. 21 illustrates an example of a case where the same processing pattern as the second modification of the first embodiment is applied to the substrate processing apparatus 10a of the third embodiment. In FIG. 21, a step of a process is denoted by "Step," the top plates 35a and 35b are denoted by "Lid, and the radio-frequency power is denoted by "RF." FIG. 21 illustrates the operation state in each step. In the graph of FIG. 21, "Center" and "Edge" correspond to the top plates 35a and 35b, respectively. It is assumed that the processing gas sources 41 and 42 supply the gas A and the gas B, respectively. The loading, unloading, and temperature adjustment of the wafer W are the same as in the first embodiment, and explanation thereof will not be repeated.

In the substrate processing method according to the sixth embodiment, the controller 60 closes the valves V7 and V8 and controls the drive devices 81a and 81b of the top plates 35a and 35b to lower the top plates 35a and 35b to reduce the volumes of the first gas diffusion chamber 38a and the second gas diffusion chamber 38b, respectively. When the opening 7 is closed and the volumes of the first gas diffusion chamber 38a and the second gas diffusion chamber 38b are reduced, the controller 60 controls the exhauster 2 to exhaust a gas from the processing chamber 5 through the exhaust port 6 such that the atmosphere of the processing chamber 5 has a predetermined degree of vacuum (Step 1 in FIG. 21). At this time, the top plates 35a and 35b are located at a lower end position (Bottom), the valves V7 and V8 are closed.

Next, when the exhaust is completed, the controller 60 controls the drive devices 81a and 81b of the top plates 35a and 35b to raise the top plates 35a and 35b. The controller 60 raises the top plates 35a and 35b to increase the volumes of the first gas diffusion chamber 38a and the second gas diffusion chamber 38b, respectively. At this time, the top plate 35b is raised to a position higher than the top plate 35a. Further, the controller 60 controls the valves V7 and V8 to be opened and the processing gas sources 41 and 42 to supply the gas A and the gas B to the gas introduction ports 46 and 47, respectively. The gas A is supplied from the gas introduction port 46 into the first gas diffusion chamber 38a and is diffused in the first gas diffusion chamber 38a. That is, the gas A is charged in the first gas diffusion chamber 38a. Further, the gas B is supplied from the gas introduction port 47 into the second gas diffusion chamber 38b and is diffused in the second gas diffusion chamber 38b. That is, the gas B is charged in the second gas diffusion chamber 38b (Step 2 in FIG. 21). Thereafter, the gas A and the gas B are supplied into the processing chamber 5 of the chamber 1 through the plurality of gas supply holes 39.

Subsequently, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIG. 21). The supply amount of the gas B supplied in Step 2 and Step 3 is larger than the supply amount of the gas A.

Next, the controller 60 controls the valves V7 and V8 to be closed, so that the supply of the gas A and the gas B is stopped. The controller 60 controls the drive devices 81a and 81b of the top plates 35a and 35b to lower the top plate 35a at a first speed and lower the top plate 35b at a second speed higher than the first speed to reduce the volumes of the first gas diffusion chamber 38a and the second gas diffusion chamber 38b. The first speed and the second speed are set such that the top plates 35a and 35b are simultaneously located at the lower end position (Bottom). The gas A and the gas B are supplied into the processing chamber 5 through the plurality of gas supply holes 39. The gas A is supplied to the center side of the wafer W, the gas B is supplied to the outer peripheral side of the wafer W Subsequently, for example, a film is formed on the wafer W by the plasma P (Step 4 in FIG. 21). When the process using the gas A and the gas B is completed, the controller 60 controls the power supply device 51 to stop the supply of radio-frequency power. That is, in Step 4, after the supply of the gas A and the gas B from the processing gas sources 41 and 42 is stopped, the top plates 35a and 35b are lowered, and the gas A and the gas B charged in the first gas diffusion chamber 38a and the second gas diffusion chamber 38b are used to perform a process using the plasma P.

When the volumes of the first gas diffusion chamber 38a and the second gas diffusion chamber 38b are reduced, the controller 60 controls the exhauster 2 to exhaust the gas A and the gas B from the processing chamber 5 (Step 5 in FIG. 21). At this time, the top plates 35a and 35b are located at the lower end position (Bottom), and the valves V7 and V8 are closed. Thereafter, the controller 60 repeats the process such as charging with the gas A and the gas B, processing with the gas A and the gas B, and exhausting.

In the sixth embodiment, since the supply of the processing gas is stopped after the lapse of predetermined time from the start of the plasma processing and the lowering of the top plates 35a and 35b is started, the processing gas exceeding the volumes of the first gas diffusion chamber 38a and the second gas diffusion chamber 38b may be supplied. Further, the exhaust time of the processing gas may be reduced.

[Seventh Modification]

Subsequently, a substrate processing method according to a seventh modification will be described. FIGS. 22A to 22F are views illustrating an example of the substrate processing method according to the seventh modification. FIGS. 22A to 22F illustrate an example of a substrate processing apparatus 10b in which a valve V5 and a gas buffer 44 are included between the processing gas source 41 and the valve V1 of the substrate processing apparatus 10, a valve V6 and a gas buffer 45 are included between the processing gas source 42 and the valve V2 of the substrate processing apparatus 10, and the valves V3 and V4 are excluded from the substrate processing apparatus 10. In the substrate processing apparatus 10b, the same components as those of the substrate processing apparatus 10 are denoted by the same reference numerals, and explanation about the configurations and operations thereof will not be repeated.

FIG. 23 is a view illustrating an example of an operation state of each part of the substrate processing apparatus according to the seventh modification. In FIG. 23, a step of a process is denoted by "Step," the top plate 35 is denoted by "Lid," and the radio-frequency power is denoted by "RF." FIG. 23 illustrates the valves V1, V2, V5 and V6, the radio-frequency power and the operation state in each step. It is assumed that the processing gas sources 41 and 42 supply the gases A and B, respectively.

Figure 22A:
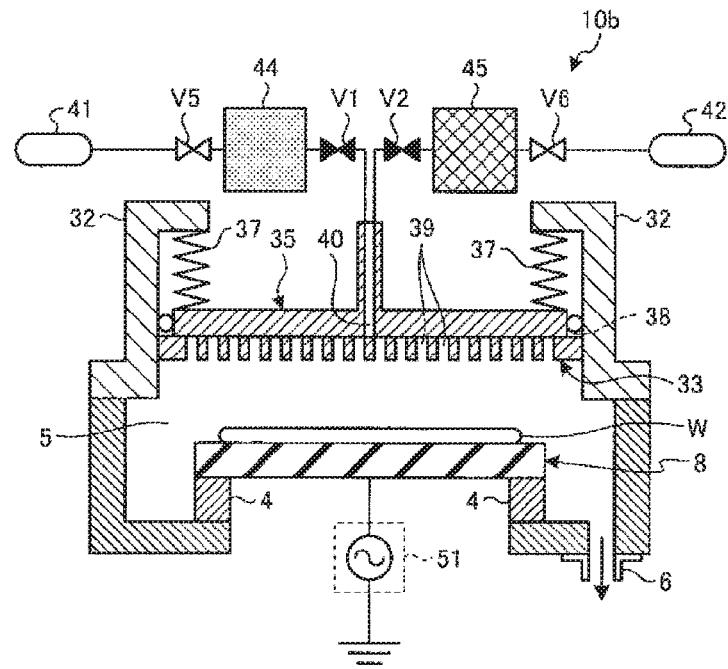
FIG. 22A is a view illustrating an example of a substrate processing method according to a seventh modification.

In the substrate processing method according to the seventh modification, as illustrated in FIG. 22A, the controller 60 closes the valves V1 and V2 and controls the drive device 81 (not illustrated in FIG. 22A) of the top plate 35 to lower the top plate 35 to reduce the volume of the gas diffusion chamber 38. When the opening 7 is closed and the volume of the gas diffusion chamber 38 is reduced, the controller 60 controls the exhauster 2 to exhaust a gas from the processing chamber 5 through the exhaust port 6 such that the atmosphere of the processing chamber 5 has a predetermined degree of vacuum (Step 1 in FIG. 23). At this time, the top plate 35 is located at a lower end position (Bottom), the valves V1 and V2 are closed, the valves V5 and V6 are opened, and the gas A and the gas B are stored in the gas buffers 44 and 45, respectively.

Figure 22B:
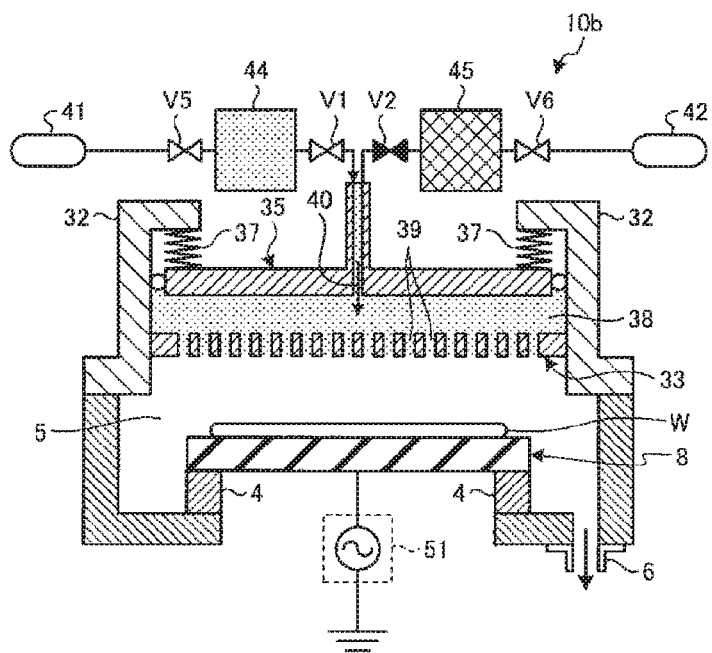
FIG. 22B is a view illustrating an example of the substrate processing method according to the seventh modification.

Next, as illustrated in FIG. 22B, when the exhaust is completed, the controller 60 controls the drive device 81 (not illustrated in FIG. 22B) of the top plate 35 to raise the top plate 35. The controller 60 moves the top plate 35 to an upper end position (Top) to increase the volume of the gas diffusion chamber 38. At this time, the controller 60 controls the valve V1 to be opened, so that the gas A stored in the gas buffer 44 is supplied to the gas introduction port 40. The gas A is supplied from the gas introduction port 40 into the gas diffusion chamber 38 and is diffused in the gas diffusion chamber 38. That is, the gas A is charged in the gas diffusion chamber 38 (Step 2 in FIG. 23).

Figure 22C:
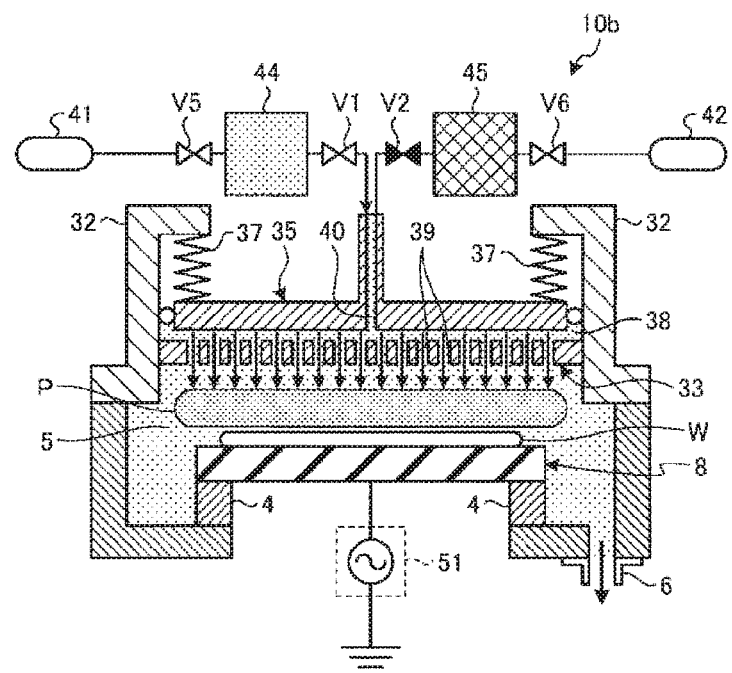
FIG. 22C is a view illustrating an example of the substrate processing method according to the seventh modification.

Subsequently, as illustrated in FIG. 22C, the controller 60 controls the drive device 81 (not illustrated in FIG. 22C) of the top plate 35 to lower the top plate 35 to reduce the volume of the gas diffusion chamber 38. The gas A is supplied into the processing chamber 5 through a plurality of gas supply holes 39. Since the valve V1 is opened, the gas A is continuously supplied.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is formed on the wafer W by the plasma P generated in the processing chamber 5 (Step 3 in FIG. 23). When the process using the gas A is completed, the controller 60 controls the power supply device 51 to stop the supply of the radio-frequency power. That is, in Step 3, while continuously supplying the gas A from the processing gas source 41 and the gas buffer 44 while adjusting the supply amount of the gas A, the top plate 35 is lowered and the gas A charged in to the gas diffusion chamber 38 while supplying the gas A is used to perform a process using the plasma P.

Figure 22D:
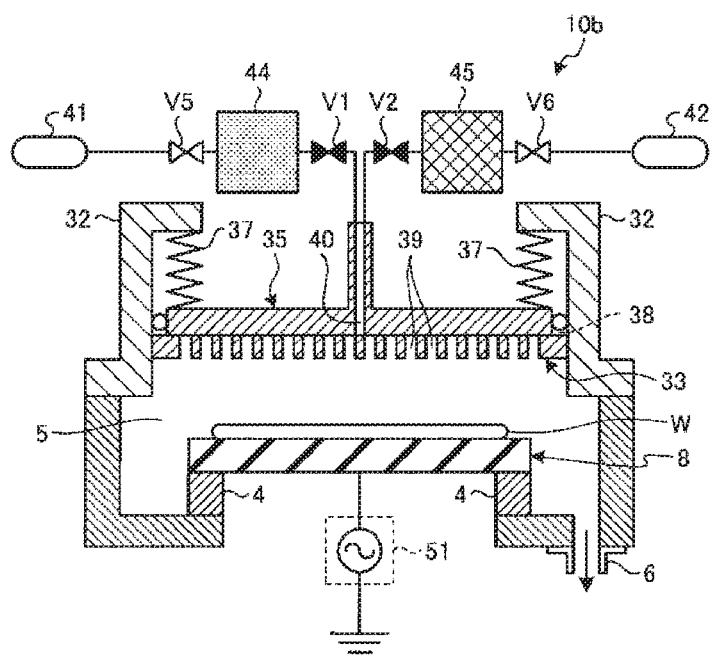
FIG. 22D is a view illustrating an example of the substrate processing method according to the seventh modification.

Next, as illustrated in FIG. 22D, the controller 60 controls the valve V1 to be closed, so that the supply of the gas A is stopped. Since the valve V1 is closed, storage of the gas A in the gas buffer 44 is started. When the volume of the gas diffusion chamber 38 is reduced, the controller 60 controls the exhauster 2 to exhaust the gas A from the processing chamber 5 (Step 4 in FIG. 23). At this time, the top plate 35 is located at the lower end position (Bottom), the valves V1 and V2 are closed, and the valves V5 and V6 are opened.

Figure 22E:
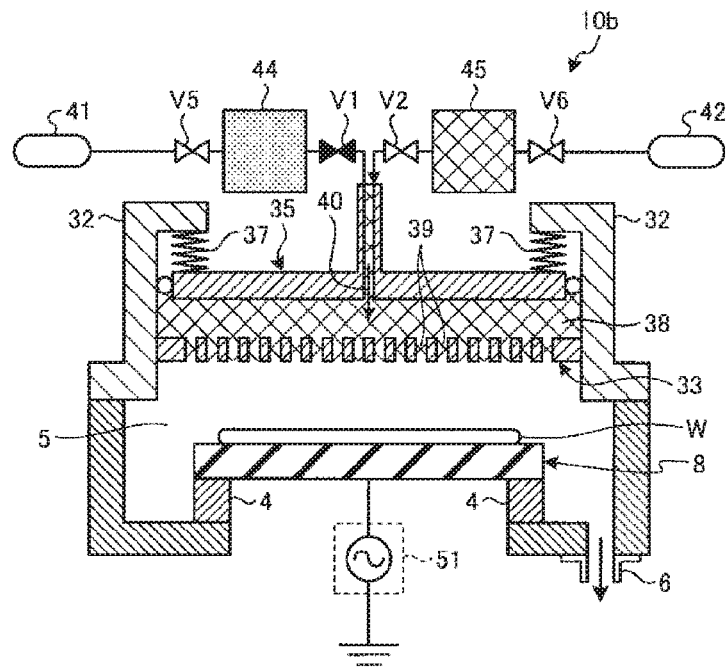
FIG. 22E is a view illustrating an example of the substrate processing method according to the seventh modification.

Next, as illustrated in FIG. 22E, when the exhaust is completed, the controller 60 controls the drive device 81 (not illustrated in FIG. 22E) of the top plate 35 to raise the top plate 35. The controller 60 moves the top plate 35 to the upper end position (Top) to increase the volume of the gas diffusion chamber 38. At this time, the controller 60 controls the valve V2 to be opened, so that the gas B stored in the gas buffer 45 is supplied to the gas introduction port 40. The gas B is supplied from the gas introduction port 40 into the gas diffusion chamber 38 and is diffused in the gas diffusion chamber 38. That is, the gas B is charged in the gas diffusion chamber 38 (Step 5 in FIG. 23).

Figure 22F:
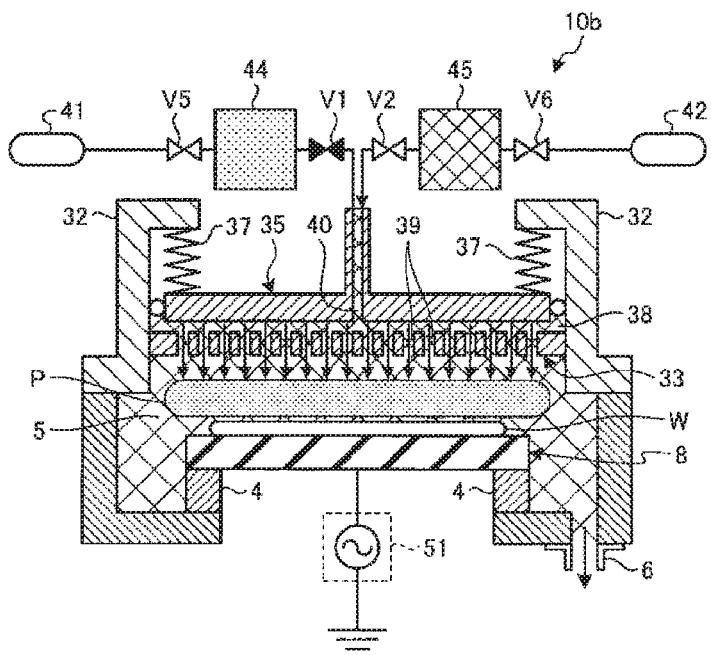
FIG. 22F is a view illustrating an example of the substrate processing method according to the seventh modification.

Subsequently, as illustrated in FIG. 22F, the controller 60 controls the drive device 81 (not illustrated in FIG. 22F) of the top plate 35 to lower the top plate 35 to reduce the volume of the gas diffusion chamber 38. The gas B is supplied into the processing chamber 5 through the plurality of gas supply holes 39. Since the valve V2 is opened, the gas B is continuously supplied.

At this time, the controller 60 controls the power supply device 51 to supply the first radio-frequency for plasma excitation to the stage 8. When the first radio-frequency is supplied to the stage 8, plasma P is generated in the processing chamber 5. For example, a film is etched on the wafer W by the plasma P generated in the processing chamber 5 (Step 6 in FIG. 23). The second radio-frequency may be supplied to the stage 8 in addition to the first-frequency for etching process. When the process using the gas B is completed, the controller 60 controls the power supply device 51 to stop the supply of the radio-frequency power. That is, in Step 6, while continuously supplying the gas B from the processing gas source 42 and the gas buffer 45 while adjusting the supply amount of the gas B, the top plate 35 is lowered and the gas B charged in the gas diffusion chamber 38 while supplying the gas B is used to perform a process using the plasma P.

Next, the controller 60 controls the valve V2 to be closed, so that the supply of the gas B is stopped. Since the valve V2 is closed, storage of the gas B in the gas buffer 45 is started. When the volume of the gas diffusion chamber 38 is reduced, the controller 60 controls the exhauster 2 to exhaust the gas B from the processing chamber 5 (Step 7 in FIG. 23). At this time, the top plate 35 is located at the lower end position (Bottom), the valves V1 and V2 are closed, and the valves V5 and V6 are opened. Thereafter, the controller 60 repeats the process such as charging with the gas A, processing with the gas A, exhausting, charging with the gas B, processing with the gas B, and exhausting.

In the seventh modification, since the gas A and the gas B stored in the gas buffers 44 and 45 are supplied at the time of supplying the processing gas, not only may the flow rate be controlled, but also the processing gas supply time may be shortened. That is, in the seventh modification, the processing time of the process may be reduced.

As described above, according to the first embodiment, the substrate processing apparatus 10 executes a substrate processing method including a first expanding step, a first gas supplying step, a first plasma processing step, and a first power stopping step. The first expanding step increases the volume of the gas diffusion chamber 38. The first gas supplying step supplies the first gas into the gas diffusion chamber 38. The first plasma processing step supplies the radio-frequency power from a radio-frequency power supply (the power supply device 51) to generate plasma in the processing chamber 5 accommodating a substrate and reduces the volume of the gas diffusion chamber 38. The first power stopping step stops the supply of the radio-frequency power after the first plasma processing step. As a result, it is possible to control the flow rate.

Further, according to the first embodiment, the substrate processing method executed by the substrate processing apparatus 10 further includes a first gas stopping step of stopping the supply of the first gas into the gas diffusion chamber 38 between the first gas supplying step and the first plasma processing step. As a result, it is possible to control the flow rate.

Further, according to the first modification, the substrate processing method executed by the substrate processing apparatus 10 further includes a first gas stopping step of stopping the supply of the first gas into the gas diffusion chamber 38 between the first plasma processing step and the first power stopping step. As a result, it is possible to supply the first gas exceeding the volume of the gas diffusion chamber 38.

Further, according to the second modification, the substrate processing method executed by the substrate processing apparatus 10 further includes a first gas stopping step of stopping the supply of the first gas into the gas diffusion chamber 38 during the first plasma processing step. As a result, it is possible to supply the first gas exceeding the volume of the gas diffusion chamber 38.

Further, according to the first embodiment, in the first plasma processing step, the speed of reducing the volume of the gas diffusion chamber 38 is changed. As a result, it is possible to control the flow rate.

Further, according to the second embodiment, the substrate processing method executed by the substrate processing apparatus 10 includes a second expanding step, a second gas supplying step, a second plasma processing step, and a second power stopping step after the first power stopping step. The second expanding step increases the volume of the gas diffusion chamber 38. The second gas supplying step supplies the second gas into the gas diffusion chamber 38. The second plasma processing step supplies the radio-frequency power to generate plasma in the processing chamber 5 and reduces the volume of the gas diffusion chamber 38. The second power stopping step stops the supply of the radio-frequency power after the second plasma processing step. As a result, it is possible to control the flow rate for each of two types of gases.

Further, according to the second embodiment, the substrate processing method executed by the substrate processing apparatus 10 further includes a second gas stopping step of stopping the supply of the second gas into the gas diffusion chamber 38 between the second gas supplying step and the second plasma processing step. As a result, it is possible to control the flow rate for each of two types of gases.

Further, according to the third modification, the substrate processing method executed by the substrate processing apparatus 10 further includes a second gas stopping step of stopping the supply of the second gas into the gas diffusion chamber 38 between the second plasma processing step and the second power stopping step. As a result, it is possible to supply the second gas exceeding the volume of the gas diffusion chamber 38.

Further, according to the fourth modification, the substrate processing method executed by the substrate processing apparatus 10 further includes a second gas stopping step of stopping the supply of the second gas into the gas diffusion chamber 38 during the second plasma processing step. As a result, it is possible to supply the second gas exceeding the volume of the gas diffusion chamber 38.

Further, according to the second embodiment, the speed of reducing the volume of the gas diffusion chamber 38 in the first plasma processing step is different from the speed of reducing the volume of the gas diffusion chamber 38 in the second plasma processing step. As a result, it is possible to control the flow rate to be different for two types of plasma processing.

Further, according to the first embodiment, the gas diffusion chamber 38 has the top plate 35, and in the substrate processing method executed by the substrate processing apparatus 10, the speed of reducing the volume of the gas diffusion chamber 38 is changed by changing the speed of lowering the top plate 35. As a result, it is possible to control the flow rate.

Further, according to the third embodiment, the gas diffusion chamber 38 has the top plates 35a and 35b divided into a plurality of regions, and is divided into the first gas diffusion chamber 38a corresponding to the top plate 35a and the second gas diffusion chamber 38b corresponding to the top plate 35b. Further, in the first plasma processing step, the volume of each of the first gas diffusion chamber 38a and the second gas diffusion chamber 38b is reduced. As a result, it is possible to control the flow rates of a plurality of gases.

Further, according to the third embodiment, the speed of reducing the volume of the first gas diffusion chamber 38a is different from the speed of reducing the volume of the second gas diffusion chamber 38b. As a result, it is possible to control the flow rates of a plurality of gases to be different from each other.

Further, according to the seventh modification, in the first gas supplying step, the first gas is stored in the first gas buffer connected in front of the gas diffusion chamber 38, and the first gas stored in the first gas buffer is supplied into the gas diffusion chamber 38. As a result, it is possible to control the flow rate and reduce the supply time of the processing gas.

Further, according to the seventh modification, in the second gas supplying step, the second gas is stored in the second gas buffer connected in front of the gas diffusion chamber 38, and the second gas stored in the second gas buffer is supplied into the gas diffusion chamber 38. As a result, it is possible to control the flow rate and reduce the supply time of the processing gas.

Further, according to the first embodiment, the first expanding step, the first gas supplying step, the first plasma processing step, the first gas stopping step, and the first power stopping step are repeated a plurality of times. As a result, it is possible to control the flow rate in the repetitive processing.

Further, according to the second embodiment, the first expanding step, the first gas supplying step, the first plasma processing step, the first gas stopping step, the first power stopping step, the second expanding step, the second gas supplying step, the second plasma processing step, the second gas stopping step, and the second power stopping step are repeated a plurality of times. As a result, it is possible to control the flow rate in the repetitive processing.

Further, according to the second embodiment, the first gas is obtained by mixing a plurality of gases, and the second gas has a different mixing ratio of the plurality of gases from the first gas. As a result, it is possible to control the flow rate for each of the gases having different mixing ratios of the plurality of gases.

For example, a step of repeating the same process using one type of processing gas is illustrated in the first embodiment, the first modification, and the second modification. The present disclosure is not limited thereto. A plurality of types of gases may be prepared as the processing gas source 41, and a process may be performed using a gas obtained by mixing these types of gases. Further, a process using the gas obtained by mixing these types of gases and a process using a gas in which the mixing ratio of the gases is changed may be repeated. Further, after the process using the gas A is performed, a different process may be continuously performed using a different gas. For example, after a film forming process using the gas A supplied from the processing gas source 41, a cleaning process may be performed using another gas supplied from the processing gas source 41. Further, after the process using the gas A is performed, the same process may be continuously performed using a different gas. For example, after main etching using the gas A supplied from the processing gas source 41 is performed, over-etching using another gas supplied from the processing gas source 41 may be performed. That is, the present disclosure may be applied to a plurality of steps in a plurality of different processes or the same process using a plurality of types of different gases. These may be equally applied to other embodiments and modifications in which the processing gas source 42 is also used. In a case of performing a process that frequently repeats a process using a different gas such as an atomic layer deposition (ALD) method, since a gas remaining in a pipe does not need to be replaced, the processing gas source 42 is preferably used in addition to the processing gas source 41.

Further, in each of the above-described embodiments, the speed of lowering the top plate 35 from the upper end position (Top) to the lower end position (Bottom) is constant as the first speed. However, the present disclosure is not limited thereto. While the top plate 35 is being lowered from the upper end position (Top) to the lower end position (Bottom), the speed of lowering the top plate 35 may be changed from the first speed to the second speed different from the first speed. That is, the speed of lowering the top plate 35 may be changed a plurality of times.

Further, in each of the above-described embodiments, the top plate 35 is raised from the lower end position (Bottom) to the upper end position (Top). However, as long as the top plate 35 may be located to be higher than the lower end position (Bottom), the top plate 35 does not have to be raised to the upper end position (Top). The raising position of the top plate 35 may be set as appropriate according to the amount of gas charged in the gas diffusion chamber, the time required for processing, and/or the lowering speed of the top plate 35.

Further, in the embodiments and modifications using the processing gas sources 41 and 42, descriptions have been made on an example in which the amounts of the gas A and the gas B charged in the gas diffusion chamber are different from each other. However, the amounts of the gas A and the gas B charged in the gas diffusion chamber may be equal to each other.

Further, an example in which the top plates 35a and 35b are lowered at different speeds has been described in the third embodiment and the sixth and seventh modifications. However, the top plates 35a and 35b may be lowered at the same speed.

Further, in each of the above-described embodiments, a capacitively-coupled plasma processing apparatus has been described as an example of the substrate processing apparatus 10. However, the present disclosure is not limited thereto. For example, any plasma source such as an inductively-coupled plasma, a microwave plasma, or a magnetron plasma may be used as the plasma source.

Moreover, in each of the above-described embodiments, a plasma processing apparatus has been described as an example of the substrate processing apparatus 10. However, the present disclosure is not limited thereto. For example, the present disclosure may be applied to a substrate processing apparatus that performs a process by alternately repeating a plurality of processing gases, such as an atomic layer deposition (ALD) method, without using plasma.

According to one embodiment of the present disclosure, it is possible to control a flow rate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
 a first expanding step of increasing a volume of a gas diffusion chamber;
 a first gas supplying step of supplying a first gas into the gas diffusion chamber,
 a first plasma processing step of supplying a radio-frequency power from a radio-frequency power supply to generate plasma in a processing chamber accommodating a substrate and reducing the volume of the gas diffusion chamber; and
 a first power stopping step of stopping the supply of the radio-frequency power after the first plasma processing step.

2. The substrate processing method according to claim 1, further comprising:
 a first gas stopping step of stopping the supply of the first gas into the gas diffusion chamber between the first gas supplying step and the first plasma processing step.

3. The substrate processing method according to claim 1, further comprising:
 a first gas stopping step of stopping the supply of the first gas into the gas diffusion chamber between the first plasma processing step and the first power stopping step.

4. The substrate processing method according to claim 1, further comprising:
 a first gas stopping step of stopping the supply of the first gas into the gas diffusion chamber during the first plasma processing step.

5. The substrate processing method according to claim 1, wherein in the first plasma processing step, a speed of reducing the volume of the gas diffusion chamber is changed.

6. The substrate processing method according to claim 1, further comprising:
 a second expanding step of increasing the volume of the gas diffusion chamber after the first power stopping step;
 a second gas supplying step of supplying a second gas into the gas diffusion chamber;
 a second plasma processing step of supplying the radio-frequency power to generate plasma in the processing chamber and reducing the volume of the gas diffusion chamber, and
 a second power stopping step of stopping the supply of the radio-frequency power after the second plasma processing step.

7. The substrate processing method according to claim 6, further comprising:
 a second gas stopping step of stopping the supply of the second gas into the gas diffusion chamber between the second gas supplying step and the second plasma processing step.

8. The substrate processing method according to claim 6, further comprising:
 a second gas stopping step of stopping the supply of the second gas into the gas diffusion chamber between the second plasma processing step and the second power stopping step.

9. The substrate processing method according to claim 6, further comprising:
 a second gas stopping step of stopping the supply of the second gas into the gas diffusion chamber during the second plasma processing step.

10. The substrate processing method according to claim 6, wherein the speed of reducing the volume of the gas diffusion chamber in the first plasma processing step is different from a speed of reducing the volume of the gas diffusion chamber in the second plasma processing step.

11. The substrate processing method according to claim 10, wherein the gas diffusion chamber has a top plate, and
 the speed of reducing the volume of the gas diffusion chamber is changed by changing a speed of lowering the top plate.

12. The substrate processing method according to claim 1, wherein the gas diffusion chamber has a plurality of top plates, and is divided into a first gas diffusion chamber and a second gas diffusion chamber that correspond to the plurality of top plates, respectively, and
 in the first plasma processing step, the volume of each of the first gas diffusion chamber and the second gas diffusion chamber is reduced.

13. The substrate processing method according to claim 12, wherein a speed of reducing a volume of the first gas diffusion chamber is different from a speed of reducing a volume of the second gas diffusion chamber.

14. The substrate processing method according to claim 6, wherein in the first gas supplying step, the first gas is stored in a first gas buffer connected in front of the gas diffusion chamber, and when the first gas is supplied into the gas diffusion chamber, the first gas stored in the first gas buffer is supplied into the gas diffusion chamber.

15. The substrate processing method according to claim 6, wherein in the second gas supplying step, the second gas is stored in a second gas buffer connected in front of the gas diffusion chamber, and when the second gas is supplied into the gas diffusion chamber, the second gas stored in the second gas buffer is supplied into the gas diffusion chamber.

16. The substrate processing method according to claim 1, further comprising:
 repeating the first expanding step, the first gas supplying step, the first plasma processing step, the first gas stopping step, and the first power stopping step a plurality of times.

17. The substrate processing method according to claim 6, further comprising:
 repeating the first expanding step, the first gas supplying step, the first plasma processing step, the first gas stopping step, the first power stopping step, the second expanding step, the second gas supplying step, the second plasma processing step, the second gas stopping step, and the second power stopping step a plurality of times.

18. The substrate processing method according to claim 6, wherein the first gas is obtained by mixing a plurality of gases, and
 the second gas has a mixing ratio of the plurality of gases different from that of the first gas.

19. The substrate processing method according to claim 5, wherein the gas diffusion chamber has a top plate, and
 the speed of reducing the volume of the gas diffusion chamber is changed by changing a speed of lowering the top plate.

* * * * *